(12) United States Patent
Lim et al.

(10) Patent No.: US 10,937,934 B2
(45) Date of Patent: Mar. 2, 2021

(54) LIGHT EMITTING DEVICE PACKAGE AND LIGHTING SOURCE DEVICE

(71) Applicant: LG INNOTEK CO., LTD., Seoul (KR)

(72) Inventors: Chang Man Lim, Seoul (KR); June O Song, Seoul (KR); Sung Min Kong, Seoul (KR); Ki Seok Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/646,660

(22) PCT Filed: Sep. 12, 2018

(86) PCT No.: PCT/KR2018/010689
§ 371 (c)(1),
(2) Date: Mar. 12, 2020

(87) PCT Pub. No.: WO2019/054750
PCT Pub. Date: Mar. 21, 2019

(65) Prior Publication Data
US 2020/0279982 A1  Sep. 3, 2020

(30) Foreign Application Priority Data
Sep. 15, 2017  (KR) .................... 10-2017-0118986

(51) Int. Cl.
*H01L 33/54* (2010.01)
*H01L 33/24* (2010.01)
(Continued)

(52) U.S. Cl.
CPC .............. *H01L 33/54* (2013.01); *H01L 33/24* (2013.01); *H01L 33/62* (2013.01)

(58) Field of Classification Search
CPC ......... H01L 33/62; H01L 33/58; H01L 33/60; H01L 33/486; H01L 33/382; H01L 33/24; H01L 25/0753
See application file for complete search history.

(56) References Cited

U.S. PATENT DOCUMENTS

2009/0039368 A1* 2/2009 Omae .................. H01L 33/46
                                                            257/98
2018/0040780 A1* 2/2018 Hirasawa ............. H01L 33/486

FOREIGN PATENT DOCUMENTS

JP    2005-317950    11/2005
JP    2006-287267    10/2006
(Continued)

OTHER PUBLICATIONS

International Search Report dated Dec. 28, 2018 issued in Application No. PCT/KR2018/010689.

*Primary Examiner* — Marcos D. Pizarro
*Assistant Examiner* — Antonio B Crite
(74) *Attorney, Agent, or Firm* — Ked & Associates, LLP

(57) ABSTRACT

The light emitting device package disclosed in the embodiment includes first and second frames spaced apart from each other; a body disposed between the first and second frames; a light emitting device disposed on the first and second frames; a first resin disposed between the body and the light emitting device, wherein each of the first and second frames includes a through hole, the through hole overlaps the light emitting device in a vertical direction, and the body includes a recess recessed toward a lower surface of the body between the first and second frames, and the recess overlaps the light emitting device in the vertical direction, the first resin is disposed in the recess, and a length of the recess is smaller than a width of the light emitting device.

20 Claims, 17 Drawing Sheets

(51) Int. Cl.
*H01L 33/62* (2010.01)
*H01L 33/38* (2010.01)
*H01L 33/60* (2010.01)
*H01L 33/48* (2010.01)
*F21K 9/00* (2016.01)

(56) References Cited

FOREIGN PATENT DOCUMENTS

| KR | 10-2011-0000730 | 1/2011 |
| KR | 10-2014-0061797 | 5/2014 |
| KR | 10-1443365 | 10/2014 |

* cited by examiner

[FIG. 1]
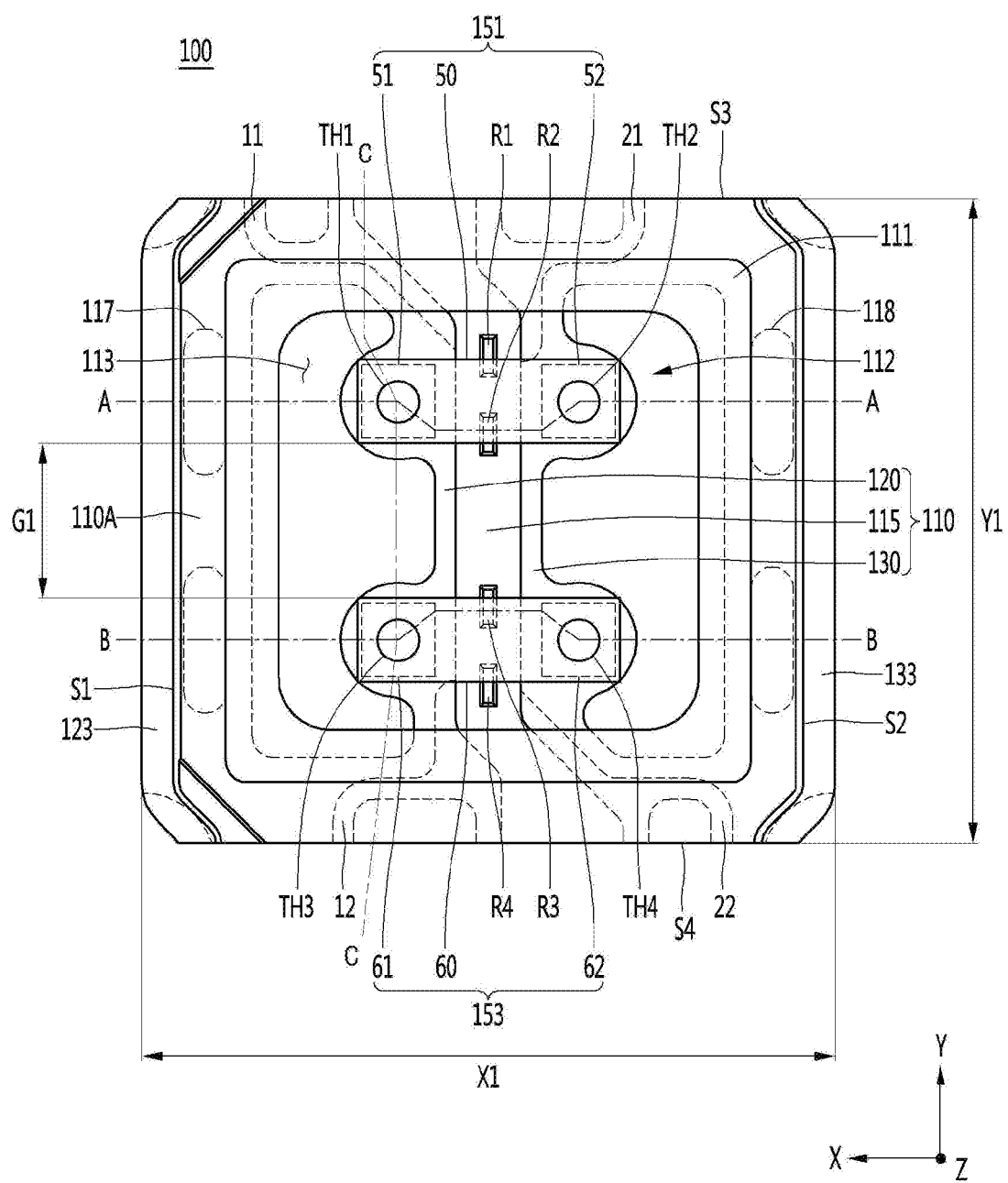

[FIG. 2]
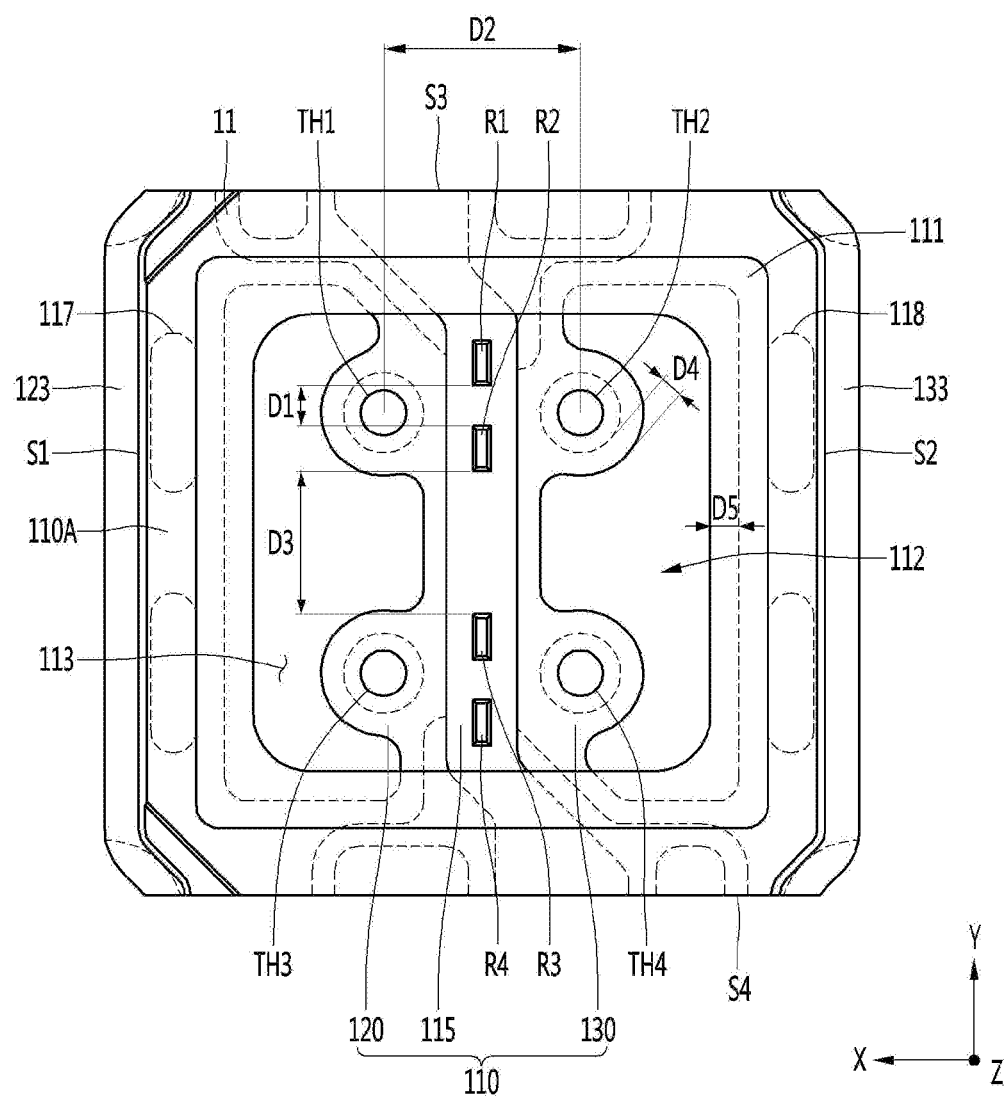

【FIG. 3】
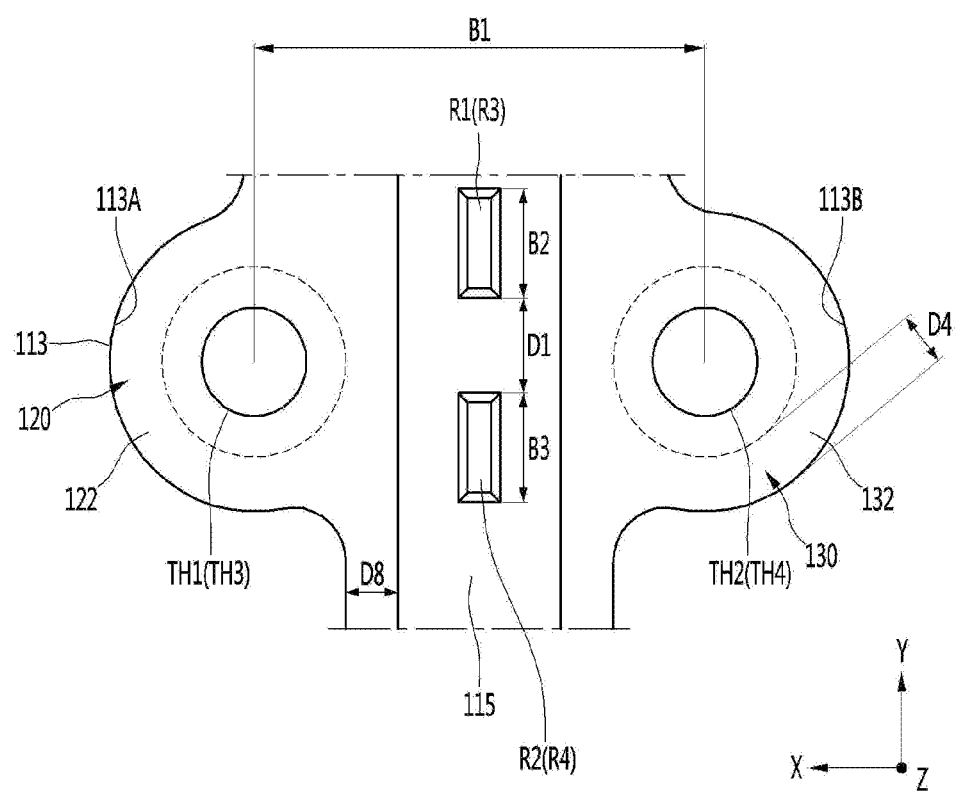

[FIG. 4]
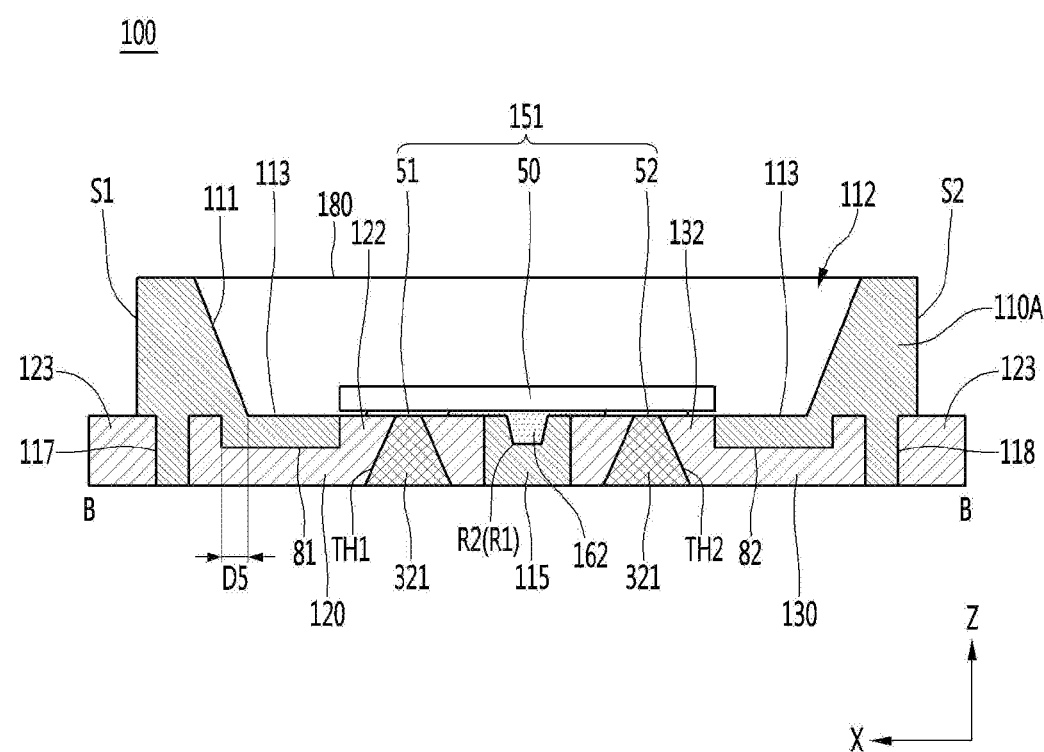

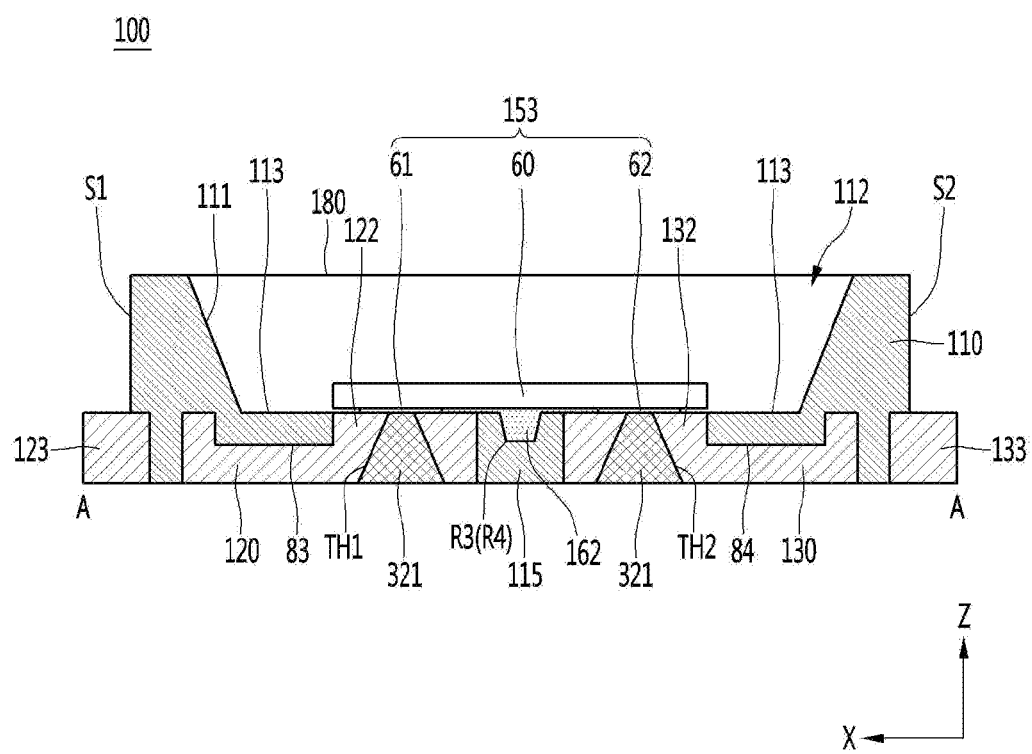
[FIG. 5]

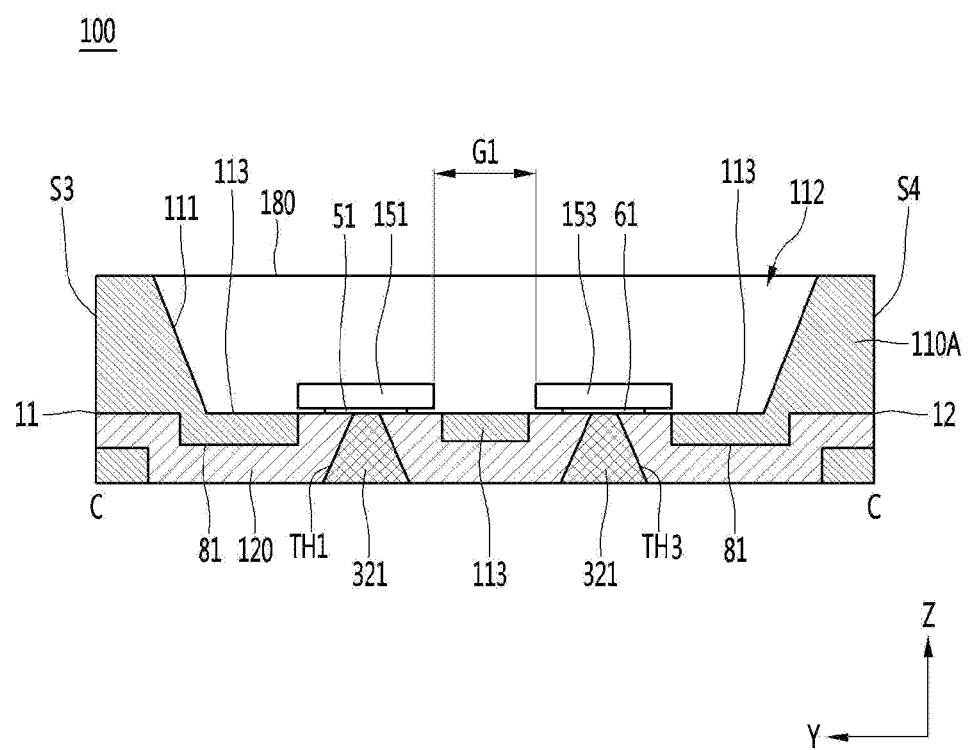
[FIG. 6]

【FIG. 7】
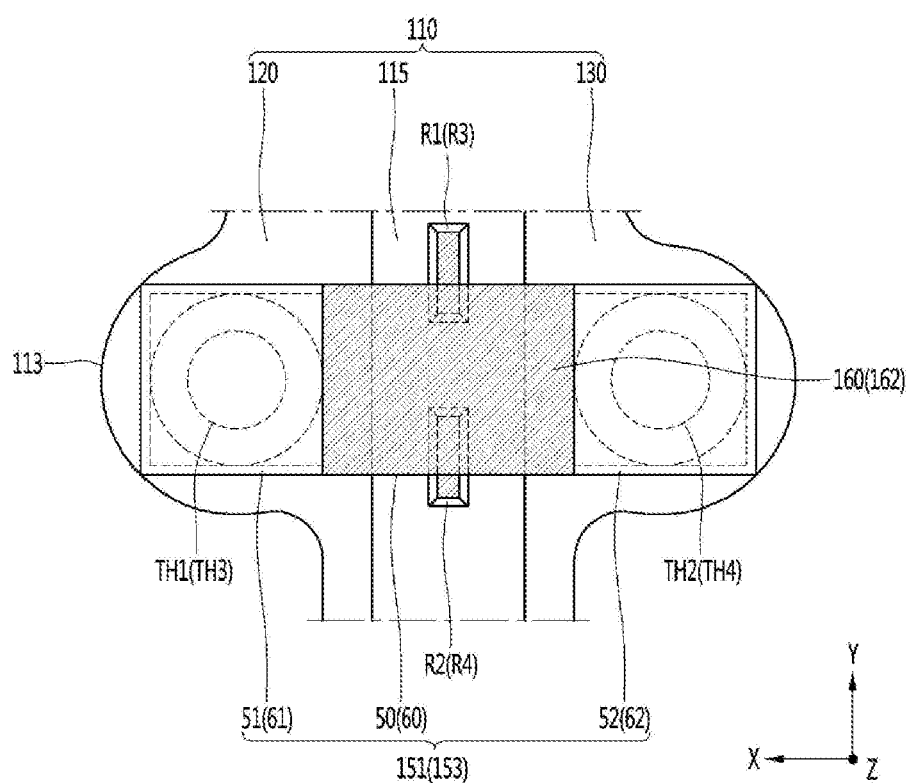

[FIG. 8]
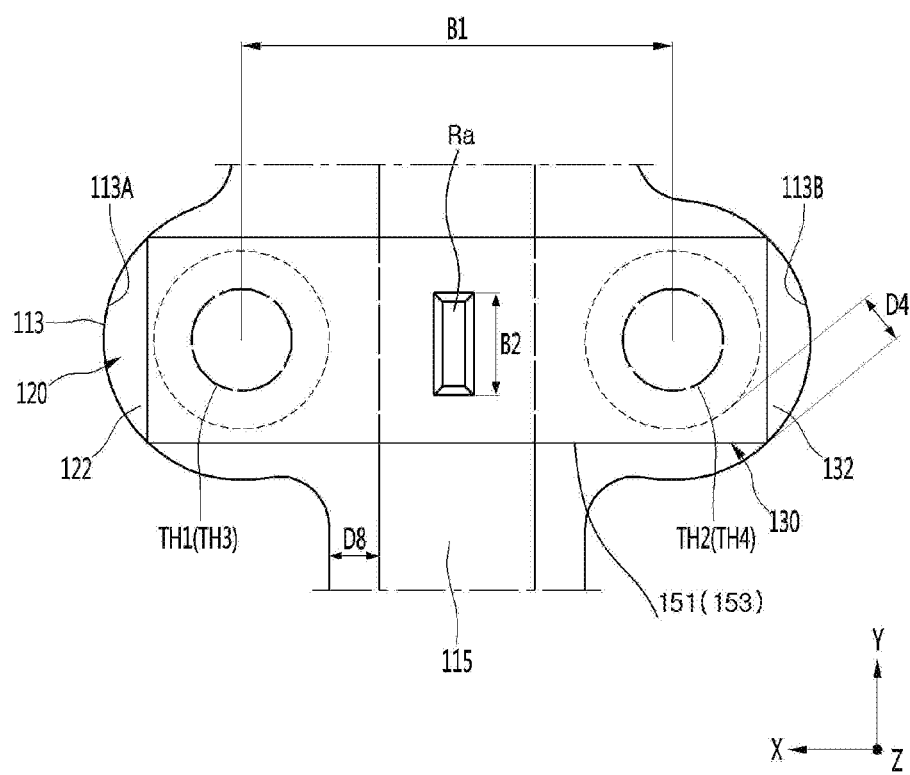

[FIG. 9]
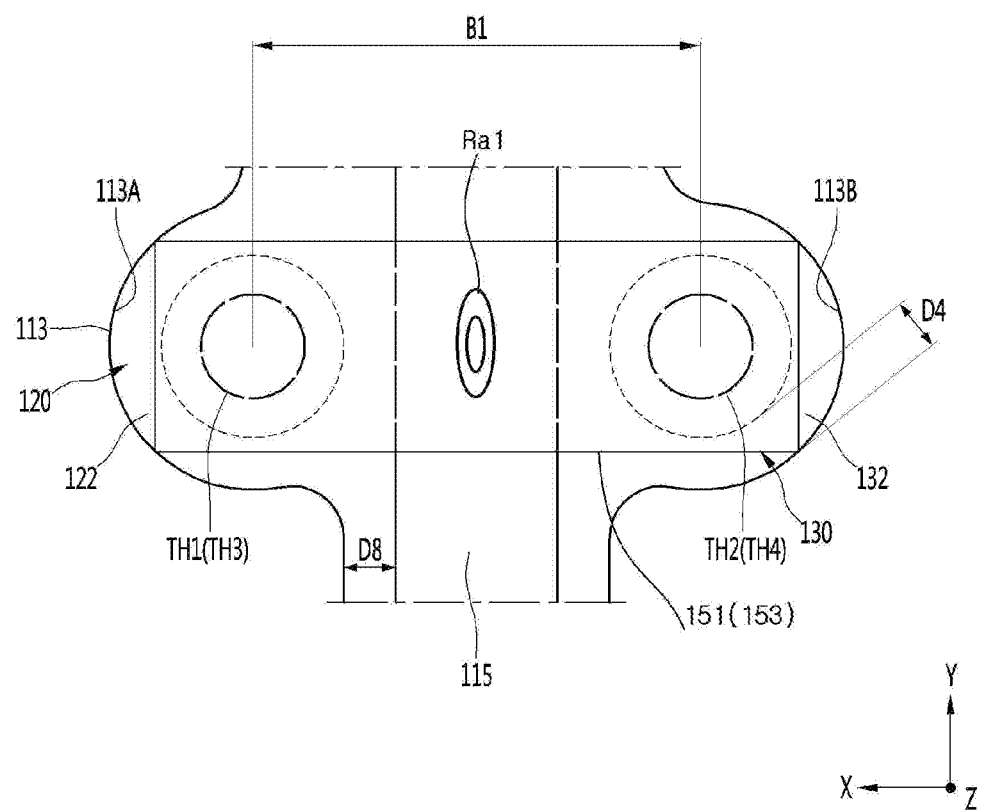

[FIG. 10]
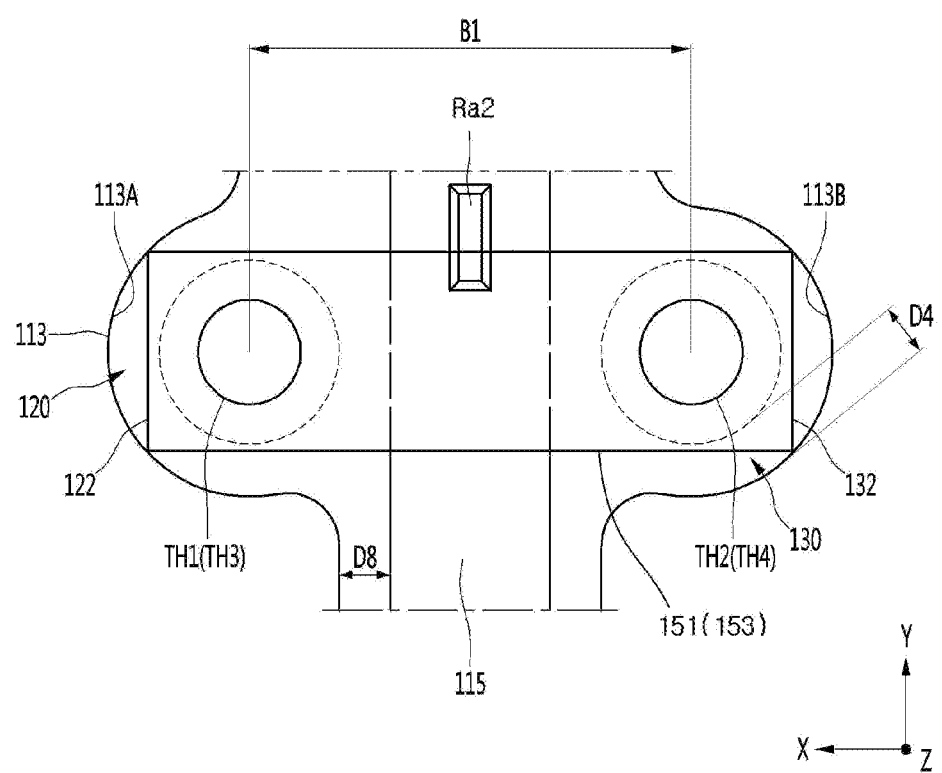

[FIG. 11]
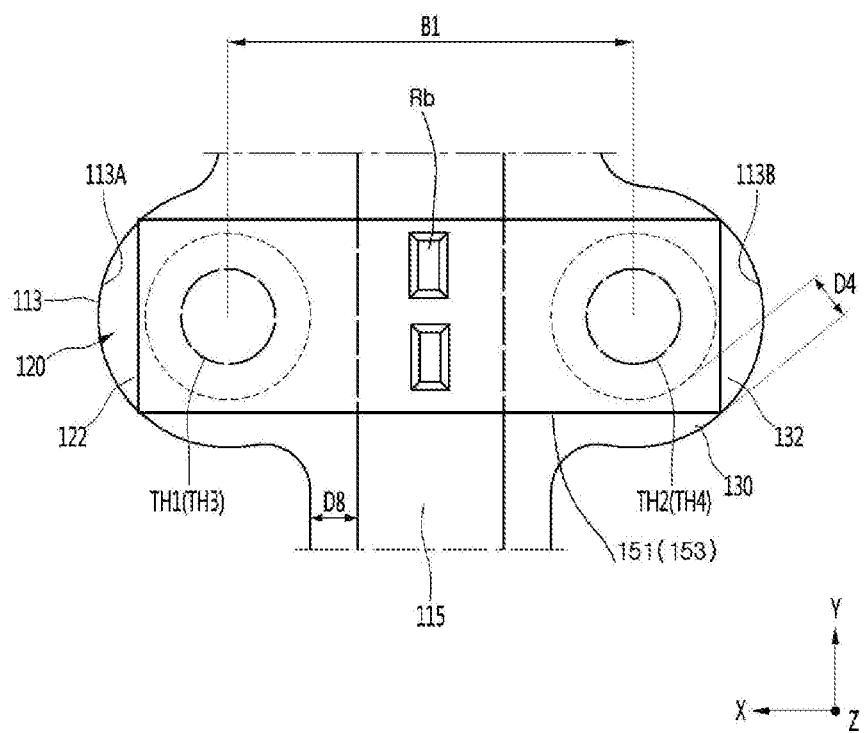

[FIG. 12]
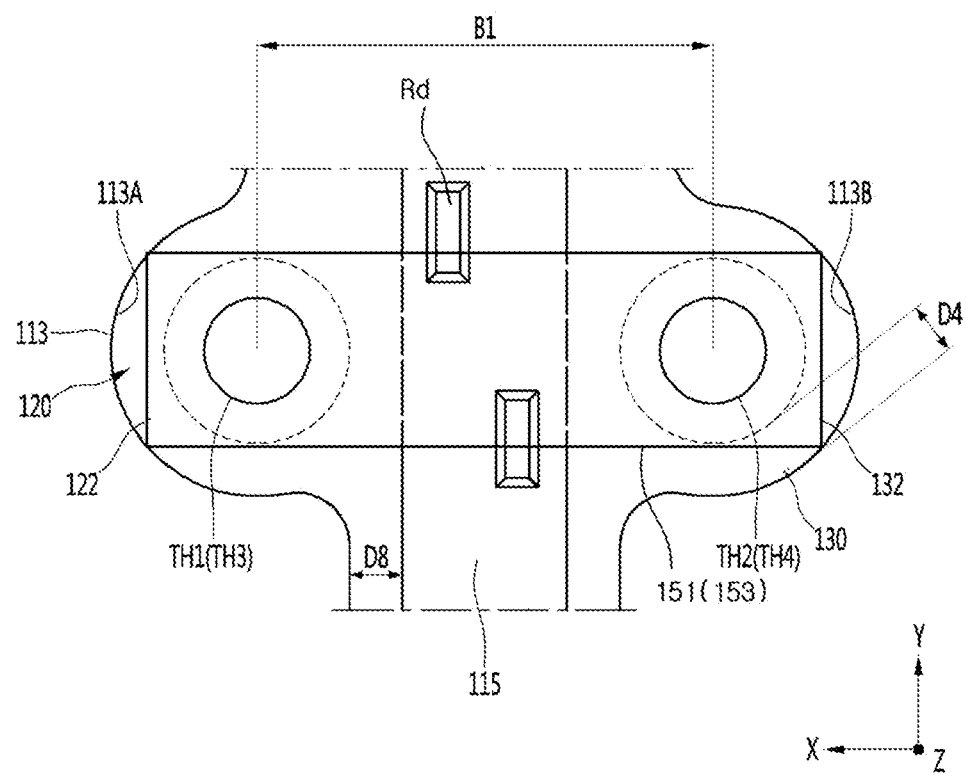

[FIG. 13]
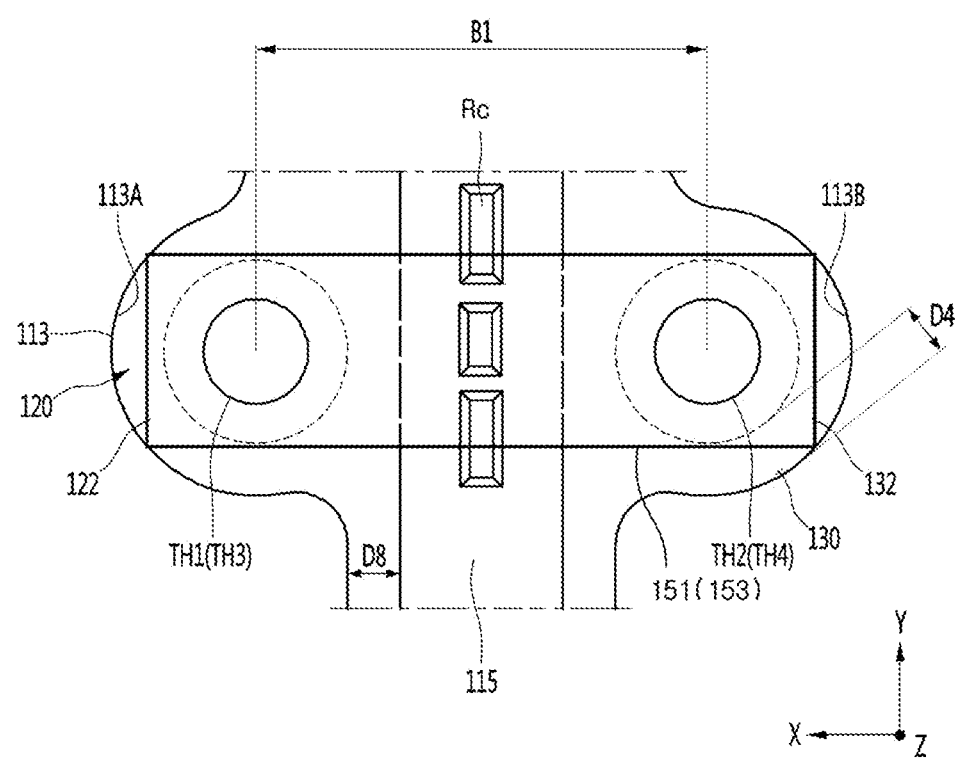

[FIG. 14]
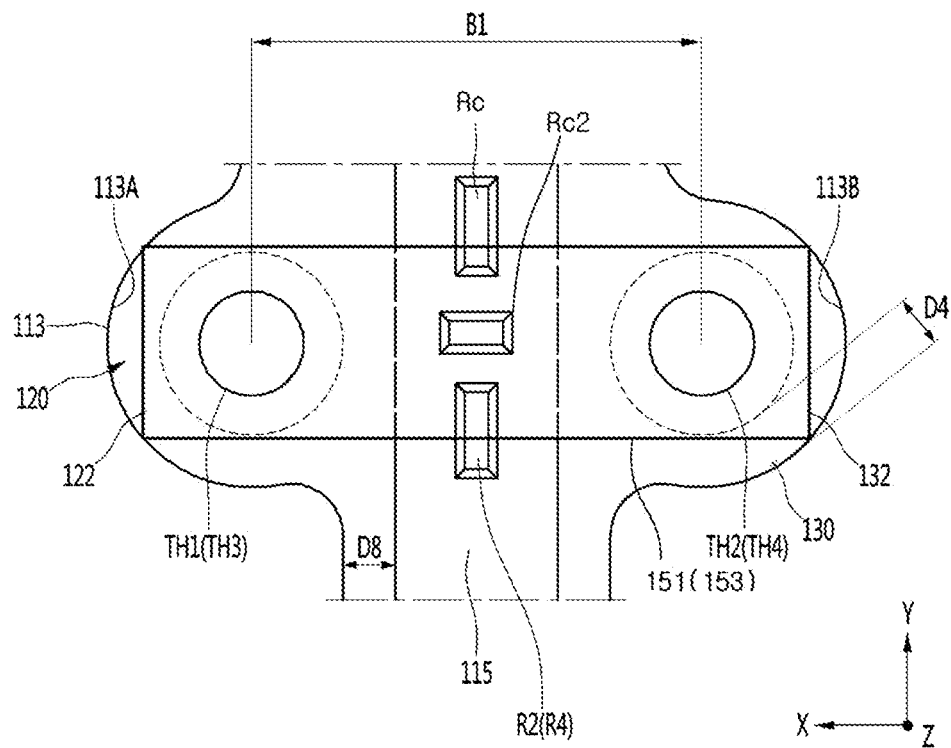
[FIG. 15]
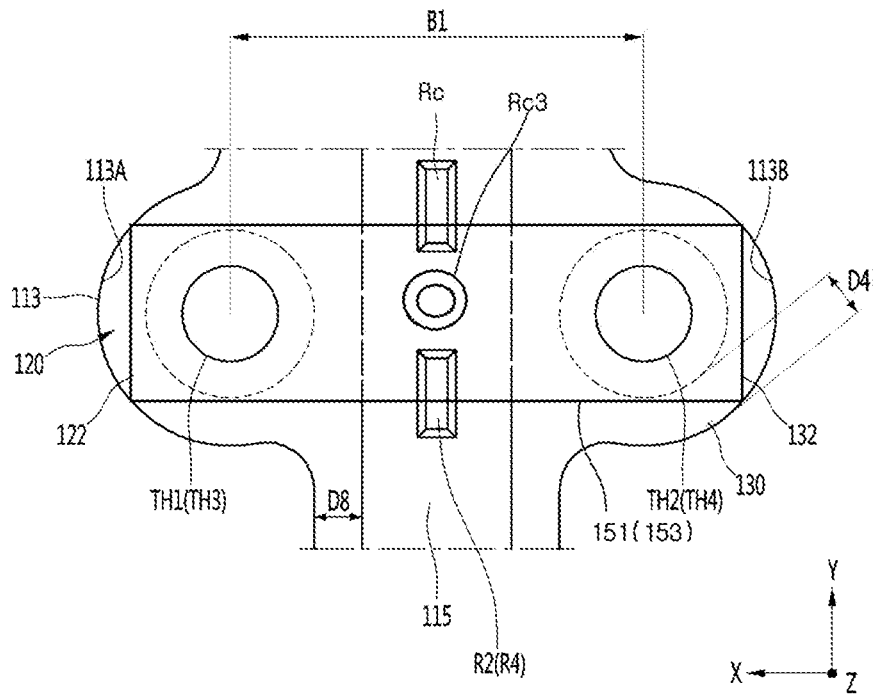

[FIG. 16]
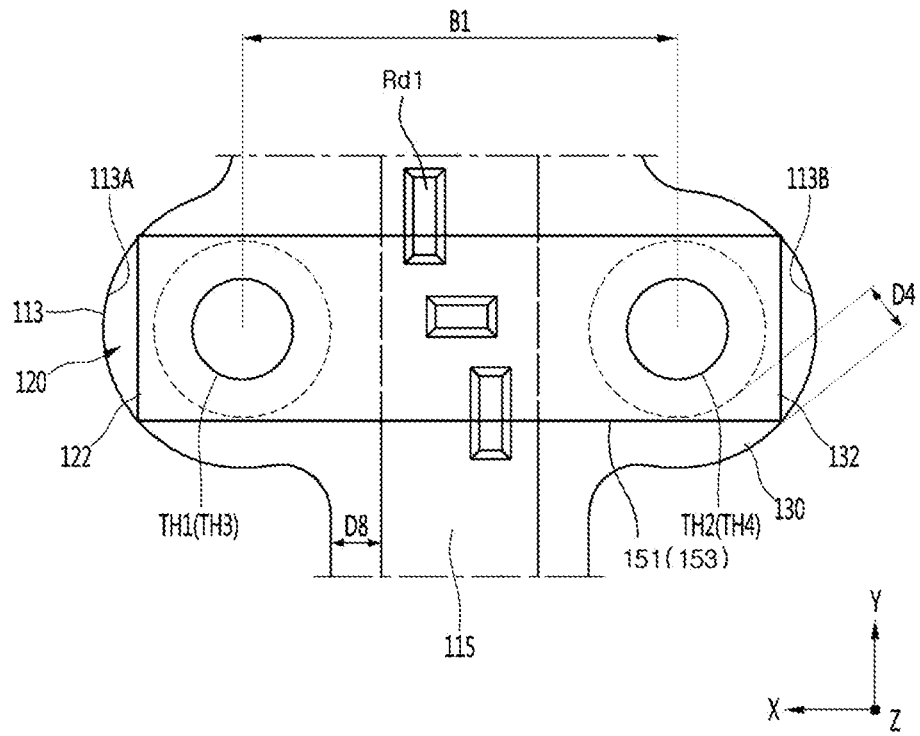
[FIG. 17]
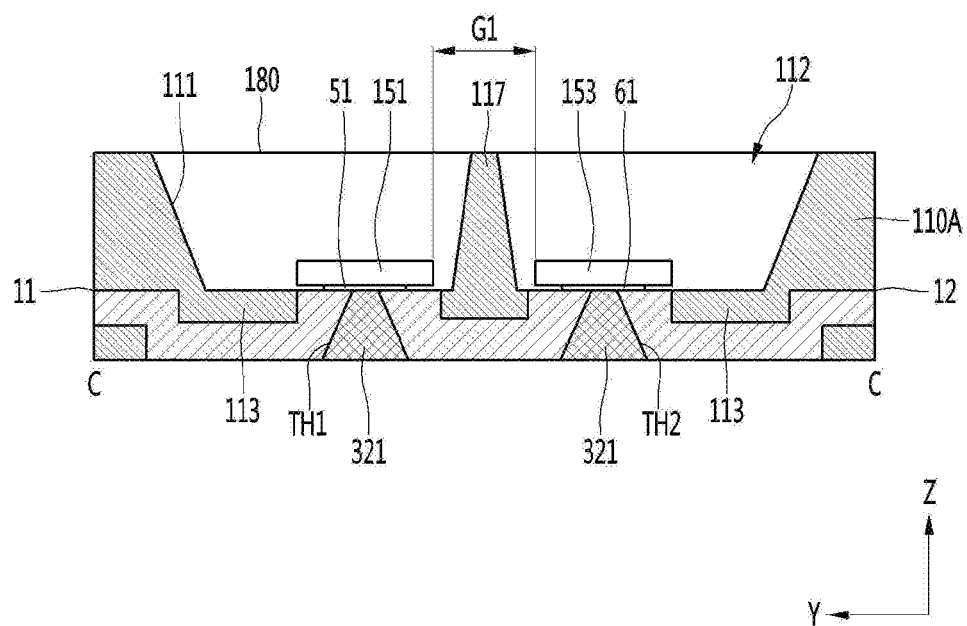

【FIG. 18】
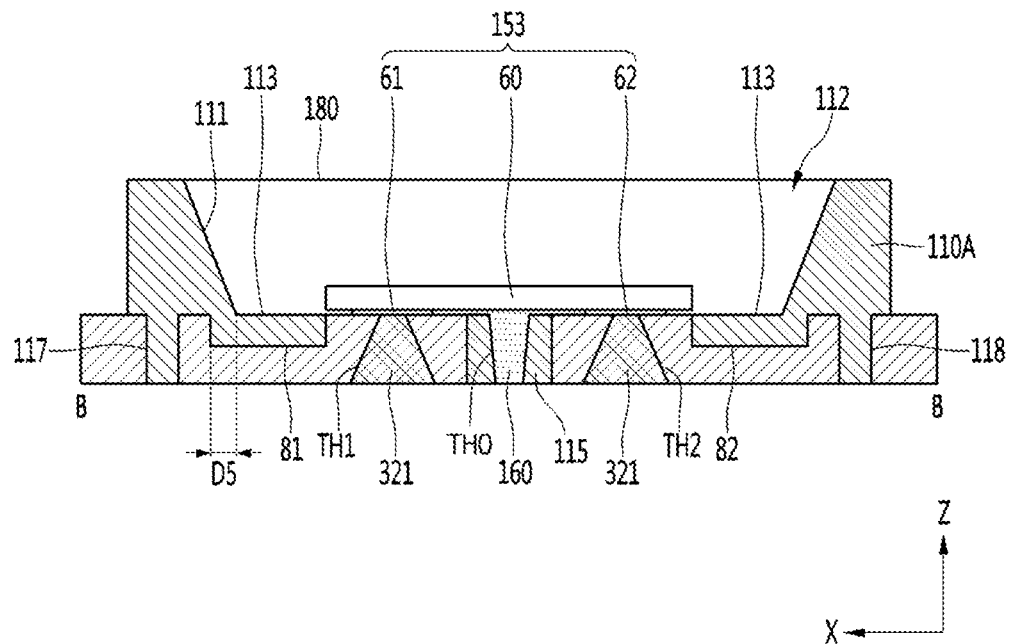
【FIG. 19】
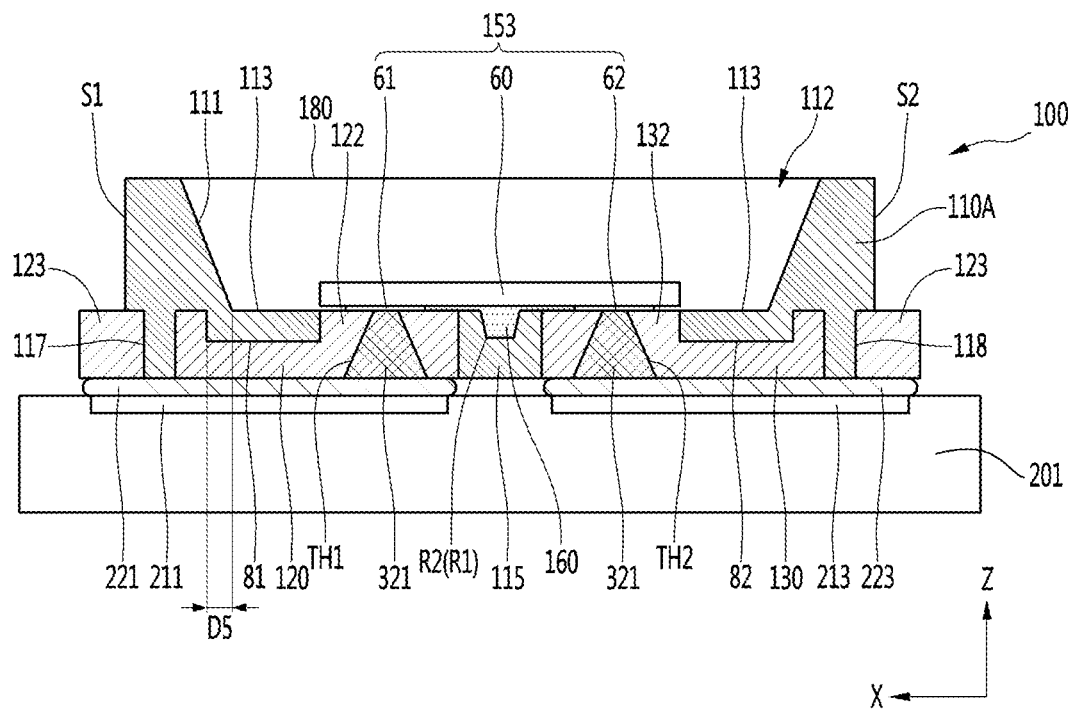

[FIG. 20]
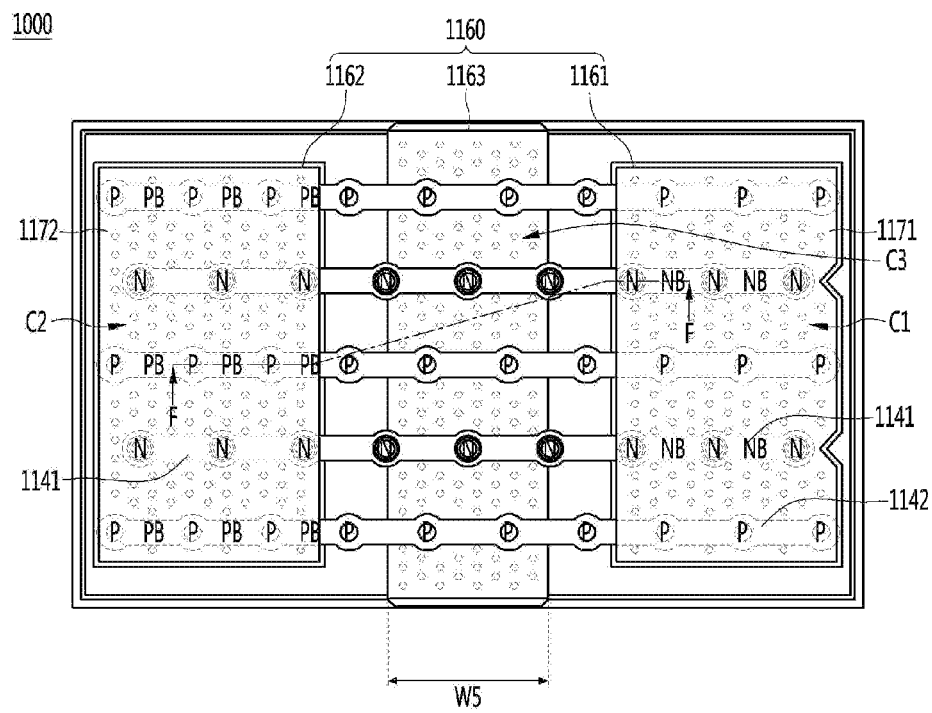
[FIG. 21]
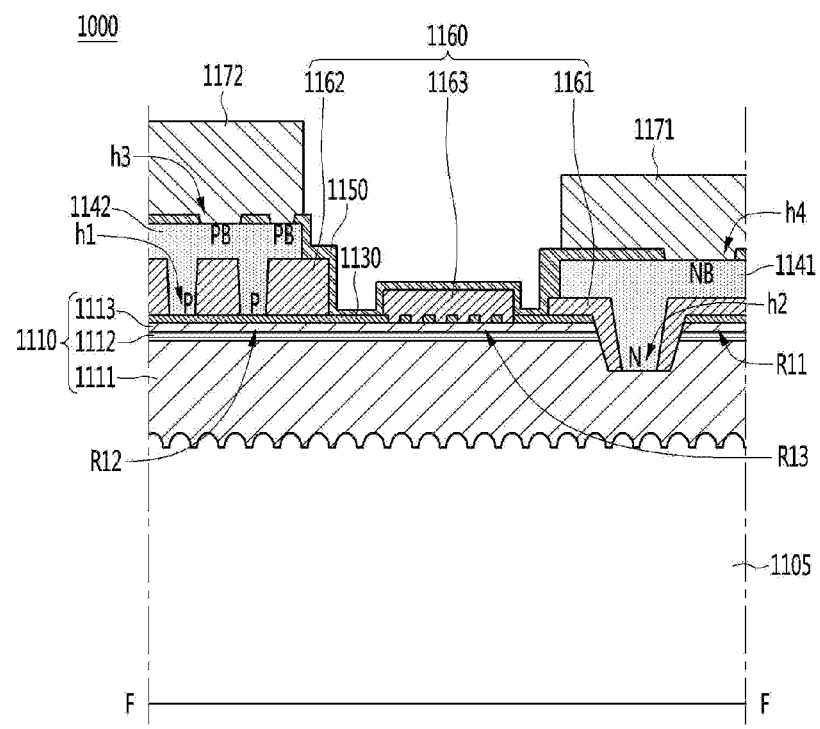

LIGHT EMITTING DEVICE PACKAGE AND LIGHTING SOURCE DEVICE

CROSS-REFERENCE TO RELATED PATENT APPLICATIONS

This application is a U.S. National Stage Application under 35 U.S.C. § 371 of PCT Application No. PCT/KR2018/010689, filed Sep. 12, 2018, which claims priority to Korean Patent Application No. 10-2017-0118986, filed Sep. 15, 2017, whose entire disclosures are hereby incorporated by reference.

TECHNICAL FIELD

An embodiment of the present invention relates to a light emitting device package and a method of manufacturing the same.

An embodiment of the present invention relates to a semiconductor device package and a method of manufacturing the same.

An embodiment of the present invention relates to a light source device having a light emitting device package.

BACKGROUND ART

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamps, or the like.

In addition, when a light-receiving device such as a photodetector or a solar cell is fabricated by using a Group III-V or Group II-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength. Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photo-catalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

Research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

DISCLOSURE

Technical Problem

An embodiment may provide a semiconductor device package or a light emitting device package in which a plurality of through holes are disposed on a lower portion of a semiconductor device or a light emitting device.

An embodiment may provide a semiconductor device package or a light emitting device package in which a plurality of through holes and a plurality of recesses are disposed on a lower portion of the semiconductor device or the light emitting device.

An embodiment may provide a semiconductor device package or a light emitting device package having a plurality of through holes spaced apart in a first direction and a plurality of recesses spaced apart in a second direction perpendicular to the first direction.

An embodiment may provide a semiconductor device package or a light emitting device package in which a conductive layer is formed in a plurality of through holes and a first resin in contact with the device is disposed in the recess on the lower portion of the device.

An embodiment may provide a semiconductor device package or a light emitting device package in which a through hole and a recess are disposed on a lower portion of each of the plurality of semiconductor devices or the plurality of light emitting devices.

An embodiment may provide a semiconductor device package or a light emitting device package in which a first resin is disposed in a recess and a conductive layer is disposed in a lower through hole of each of the plurality of semiconductor devices or the plurality of light emitting devices.

An embodiment may provide a semiconductor device package or a light emitting device package in which a plurality of semiconductor devices or a plurality of light emitting devices are disposed in parallel on at least two frames spaced apart from each other.

An embodiment may provide a semiconductor device package or a light emitting device package in which a plurality of semiconductor devices or a plurality of light emitting devices spaced apart from each other are connected by a conductive layer on at least two frames spaced from each other.

An embodiment may provide a semiconductor device package or a light emitting device package in which a bonding portion of a semiconductor device or a light emitting device facing a through hole of a frame is electrically connected to a conductive layer.

An embodiment may provide a semiconductor device package or a light emitting device package capable of improving light extraction efficiency and electrical characteristics.

An embodiment may provide a semiconductor device package or a light emitting device package that may improve process efficiency and propose a new package structure to reduce manufacturing cost and improve manufacturing yield.

An embodiment may provide a semiconductor device package or a light emitting device package capable of preventing re-melting from occurring in a bonding region of the semiconductor device package while the semiconductor device package is re-bonded to a circuit board.

Technical Solution

A light emitting device package according to the embodiment may comprise: first and second frames spaced apart from each other; a body disposed between the first and second frames; a light emitting device disposed on the first and second frames; a first resin disposed between the body and the light emitting device, wherein each of the first and second frames includes a through hole, the through hole overlaps the light emitting device in a vertical direction, and the body includes a concave recess toward a lower surface of the body disposed between the first and second frames, wherein the recess overlaps the light emitting device in the vertical direction, the first resin is disposed in the recess, and a length of the recess is smaller than a width of the light emitting device.

According to an embodiment of the present invention, a through hole may be disposed in plurality under the light emitting device, and the recess may be disposed in the body disposed between the plurality of through holes.

According to an embodiment of the present invention, the light emitting device may include a plurality of light emitting devices spaced apart from each other, and a plurality of recesses may be disposed on a lower portion of each of the plurality of light emitting devices.

According to an embodiment of the present invention, the first frame includes a first upper recess which is concave from an upper surface, the second frame includes a second upper recess which is concave from an upper surface, the body is extended to the first and second upper recesses, and the first and second upper recesses may be disposed around the through hole.

According to an embodiment of the present invention, an interval between the plurality of light emitting devices may be smaller than an interval between the recesses disposed under different light emitting devices.

According to an embodiment of the present invention, a distance between a lower portion of the through hole and the first and second upper recesses may be 80 micrometers or more.

According to an embodiment of the present invention, a plurality of recesses disposed under each of the light emitting devices may extend further outwards than both sides of each of the light emitting devices.

According to an embodiment of the present invention, the plurality of light emitting devices may be connected in parallel and a conductive layer is disposed in the through hole.

A light source device according to an embodiment of the present invention may comprise: a circuit board in which a plurality of pads is disposed thereon; and a light emitting device package disposed on the plurality of pads, wherein the light emitting device package comprises: first and second frames; a body between the first and second frames; a first light emitting device disposed in first regions of the first and second frames; a second light emitting device on second regions of the first and second frames; and a first resin between the body and the first and second light emitting devices, wherein the first and second light emitting devices include first and second bonding portions on lower portions of the first and second light emitting devices. The first and second frames disposed on the first region include first and second through holes under the first and second bonding portions of the first light emitting device, and the first and second frames disposed on the second region include third and fourth through holes under the first and second bonding portions of the second light emitting device, wherein the body includes a recess disposed between the first and second through holes and overlapping the first light emitting device in a vertical direction; and a second recess disposed between the third and fourth through holes and overlapping the second light emitting device in the vertical direction, wherein the first resin is disposed in the first and second recesses. A conductive layer is disposed in the first to fourth through holes may and connecting each of the plurality of pads and each of the plurality of bonding portions.

Advantageous Effects

According to a method of manufacturing a light emitting device package, a semiconductor device package and a semiconductor device package according to the embodiment, the conductive layer may be provided in an opening of the frame to the bonding portions of the semiconductor device or the light emitting device, thereby improving the adhesive force and the electric conductivity of the bonding portion.

According to the semiconductor device package and a method of manufacturing the semiconductor device package according to the embodiment, a plurality of semiconductor devices or a plurality of light emitting devices are connected in parallel, thereby improving the brightness of the package.

The embodiment may improve CRI using a plurality of blue light emitting devices having peak wavelength differences.

According to the semiconductor device package and a method of manufacturing the semiconductor device package according to the embodiment, there is an advantage that may improve the light extraction efficiency, electrical characteristics and reliability.

According to the semiconductor device package and a method of manufacturing the semiconductor device package according to the embodiment, there is an advantage that may improve the process efficiency and propose a new package structure to reduce the manufacturing cost and improve the manufacturing yield.

The semiconductor device package according to the embodiment may provide a body having a high reflectance, thereby preventing a reflective body from being discolored, thereby improving the reliability of the semiconductor device package.

According to the semiconductor device package and a method of manufacturing the semiconductor device according to the embodiment, it is possible to prevent a re-melting phenomenon from occurring in the bonding region of the semiconductor device package in the process of re-bonding the semiconductor package to the substrate and the like.

The reliability of the semiconductor device package or the light emitting device package according to an embodiment may be improved.

DESCRIPTION OF DRAWINGS

FIG. 1 is a perspective view of a light emitting device package according to an embodiment of the present invention.

FIG. 2 is a plan view illustrating a bottom of a cavity in the light emitting device package of FIG. 1.

FIG. 3 is an enlarged view of a portion around an opening and recess on the bottom of the cavity of FIG. 2.

FIG. 4 is a cross-sectional view taken along line A-A of the light emitting device package of FIG. 1.

FIG. 5 is a cross-sectional view taken along line B-B of the light emitting device package of FIG. 1.

FIG. 6 is a cross-sectional view taken along line C-C of the light emitting device package of FIG. 2.

FIG. 7 is a view illustrating an example of a region of a first resin in the light emitting device package of FIG. 1.

FIGS. 8 to 16 are modified examples of the recess of the light emitting device package according to the embodiment.

FIG. 17 is a view illustrating a package having an inner wall portion in FIG. 6 as another example of the light emitting device package of FIG. 1.

FIG. 18 is a view showing a package having a through hole in the body in FIG. 6.

FIG. 19 is an example of a lighting module having a light emitting device package according to an embodiment.

FIG. 20 is a plan view showing an example of a device according to the embodiment.

FIG. 21 is a cross-sectional view taken along line F-F of the light emitting device of FIG. 20.

BEST MODE

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment will be described in detail with reference to accompanying drawings. The semiconductor device of the device package may include a light emitting device emitting light such as ultraviolet, infrared, or visible light. Hereinafter, as an example of a semiconductor device, a case where a light emitting device is applied will be described, and a package or a light source unit to which the light emitting device is applied may include a non-light emitting device such as a Zener diode or a sensing device for monitoring a wavelength or heat. Hereinafter, as an example of a semiconductor device, a case where a light emitting device is applied will be described, and a light emitting device package will be described in detail.

FIG. 1 is a perspective view of a light emitting device package according to an embodiment of the present invention, FIG. 2 is a plan view illustrating a bottom of a cavity in the light emitting device package of FIG. 1, FIG. 3 is an enlarged view of a portion around an opening and recess on the bottom of the cavity of FIG. 2, FIG. 4 is a cross-sectional view taken along line A-A of the light emitting device package of FIG. 1, FIG. 5 is a cross-sectional view taken along line B-B of the light emitting device package of FIG. 1, FIG. 6 is a cross-sectional view taken along line C-C of the light emitting device package of FIG. 2, and FIG. 7 is a view illustrating an example of a region of a first resin in the light emitting device package of FIG. 1.

Referring to FIGS. 1 to 7, a light emitting device package 100 according to the embodiment includes a plurality of frames 120 and 130 spaced apart from each other, a body 115 supporting the plurality of frames 120 and 130, and a light emitting devices 151 and 153 disposed on the plurality of frames 120 and 130. Hereinafter, the package will be described as the light emitting device package in which the light emitting devices 151 and 153 are disposed. The package body 110 may include the plurality of frames 120 and 130 and the body 115.

The light emitting device package 100 may have the same length or different lengths in a first direction X and in a second direction. The length of the first direction in the light emitting device package 100 may be 2.5 mm or more, for example, in the range of 2.5 to 8 mm. The length of the second direction may be equal to or greater than the length of the first direction. A thickness of the light emitting device package 100 may be smaller than the lengths of the first and second directions.

The package body 110 may have the same length or different lengths in the first direction and in the second direction. The first direction may be an X direction, the second direction may be a Y direction orthogonal to the X direction, and the third direction may be a Z direction orthogonal to the X and Y directions. The third direction may be a vertical direction or a height or thickness direction of the package body 110. The package body 110 may have a length X1 in the X direction greater or smaller than a length Y1 in the Y direction. When the length of the X direction is longer than the length of the Y direction, the width of the light emitting devices 151 and 153 may be reduced in the Y direction, thereby improving brightness, and when the length Y1 in the Y direction may be greater than the length X1 in the X direction, the width of the light emitting devices 151 and 153 in the Y direction may be increased.

The package body 110 may include first and second side portions S1 and S2 disposed on opposite sides from each other, and third and fourth side portions S3 and S4 disposed on opposite sides from each other. The first and second side portions S1 and S2 have a long length in the Y direction and may be connected to both ends of the third and fourth side portions S3 and S4. The first to fourth side portions S1, S2, S3, and S4 may be formed in a plane perpendicular or inclined with respect to a bottom of the body 115.

The package body 110 may include reflective sidewall 110A disposed around the light emitting devices 151 and 153. The reflective sidewall 110A may have a cavity 112 which an upper portion is open. Frames 120 and 130 may be exposed on the bottom of the cavity 112. As another example, the sidewall 110A may be a translucent material.

<Frame (120,130)>

Referring to FIGS. 2, 4, and 5, the plurality of frames 120 and 130 may include a first frame 120 and a second frame 130. The first frame 120 and the second frame 130 may be spaced apart from each other. The first and second frames 120 and 130 may be spaced apart in the first direction X. The first and second frames 120 and 130 may be provided as conductive frames. The first frame 120 and the second frame 130 may stably provide structural strength of the body 115 and may be electrically connected to the light emitting devices 151 and 153. The light emitting devices 151 and 153 may be disposed in one or plural. The plurality of light emitting devices 151 and 153 may include a first light emitting device 151 and a second light emitting device 153 spaced apart from each other. The first and second light emitting devices 151 and 153 may be disposed on the first and second frames 120 and 130. The first and second light emitting devices 151 and 153 may overlap the first and second frames 120 and 130 in the third direction. The first and second light emitting devices 151 and 153 may be spaced apart from each other in the second direction Y.

When the first and second frames 120 and 130 are conductive frames, the first and second frames 120 and 130 may be defined as lead frames, and may radiate heat or reflect light generated from the light emitting devices 151 and 153. When the first and second frames 120 and 130 are conductive materials, the first and second frames 120 and 130 may include a metal, for example, at least one of platinum (Pt), titanium (Ti), nickel (Ni), copper (Cu), gold (Au), tantalum (Ta), aluminum (Al) and silver (Ag), and may be formed in a single layer or a multilayer having different metal layers.

As another example, the first and second frames 120 and 130 may be provided as insulating frames. When the first and second frames 120 and 130 are insulating frames, the structural strength of the package body 110 may be stably provided. When the first and second frames 120 and 130 are the insulating frames, the body 115 and the frames 120 and 130 may be integrally formed of the same material or different materials. The difference between the case where the first and second frames 120 and 130 are formed of an insulating frame and the case of the conductive frame will be further described later.

When the first and second frames 120 and 130 are insulating materials, the first and second frames 120 and 130 may be resin materials or insulating materials. For example, the first and second frames 120 and 130 may be formed of at least one select the group consisting of Polyphthalamide (PPA), Polychloro triphenyl (PCT), liquid crystal polymer (LCP), Polyamide 9T (PA9T), silicon, epoxy molding compound (EMC), silicon molding compound (SMC), ceramic, photosensitive glass (PSG), sapphire (Al2O3) and the like. In addition, the first and second frames 120 and 130 may include high refractive fillers such as TiO2 and SiO2 in an epoxy material. The first and second frames 120 and 130 may be formed of a reflective resin material.

Referring to FIGS. 1 and 2, a first extension portion 123 may protrude further outward than the first side portion S1 of the package body 110. The first extension portion 123 may be extended from the first frame 120. The first extension portion 123 may protrude outward from the first frame 120 through the first side portion S1. The length of the first extension portion 123 in the Y direction may be an equal to the length Y1 of the Y direction of the package body 110 or a length of ½ or more of the length Y1. The first frame 120 having the first extension portion 123 may prevent the heat dissipation area from being reduced and may enhance a coupling force between the package body 110 and the body 115. The width of the X direction in which the first extension portion 123 protrudes may be at least 50 micrometers or more.

A second extension portion 133 may protrude outwardly from the second side portion S2 of the package body 110. The second extension portion 133 may be extended outwardly from any one part of the second frame 130. The second extension portion 133 may protrude outward from the second frame 130 through the second side portion S2. A length of the second extension portion 133 in the Y direction may be an equal to the length Y1 of the Y direction of the package body 110 or a length of ½ or more of the length Y1. The second frame 130 having the second extension portion 133 may prevent the heat dissipation area from being reduced and may enhance the coupling force between the package body 110 and the body 115. The width in the X direction where the second extension portion 133 protrudes may be at least 50 micrometers or more.

As shown in FIG. 1, the first frame 120 includes a first protrusion 11, and the first protrusion 11 protrudes in a direction of the third side portion S3 of the package body 110 and may be exposed to the third side portion S3. The first frame 120 includes a second protrusion 12, and the second protrusion 12 protrudes in the direction of the fourth side portion S4 of the package body 110 and may be exposed to the fourth side portion S4. Each of the first and second protrusions 11 and 12 may be branched into one or more parts and exposed to the third or fourth side portions S3 and S4.

The second frame 130 includes a third protrusion 21, and the third protrusion 21 protrudes in the direction of the third side portion S3 of the package body 110 and may be exposed to the third side portion S3. The second frame 130 includes a fourth protrusion 22, and the fourth protrusion 22 protrudes in the direction of the fourth side portion S4 of the package body 110 and may be exposed to the fourth side portion S4. Each of the third and fourth protrusions 21 and 22 may be branched into one or a plurality and exposed to the third or fourth side portions S3 and S4.

The first to fourth protrusions 11, 12, 21, and 22 may have a stepped structure and may be exposed to positions spaced apart from the bottom surface of the package body 110. The first to fourth protrusions 11, 12, 21, and 22 may be coupled to the package body 110 or the body 115 to support the frames 111 and 112.

Referring to FIG. 4, upper recesses 81 and 82 may be provided on upper portions of the first and second frames 120 and 130, respectively. The first frame 120 includes a first upper recess 81 which an upper portion is concave, and the first upper recess 81 may be disposed outside the flat portion 122 where the light emitting devices 151 and 153 are disposed. The flat portion 122 may be a region in which an upper surface of the first frame 120 in which the first upper recess 81 is not formed is disposed.

The second frame 130 includes has a second upper recess 82 which an upper portion is concave, and the second upper recess 82 may be disposed outside the flat portion 132 where the light emitting devices 151 and 153 are disposed. The flat portion 132 may be a region in which an upper surface of the second frame 130 in which the second upper recess 82 is not formed is disposed.

In the first and second frames 120 and 130, an inner portions of the first and second upper recesses 81 and 82 may overlap the bottom 113 of the cavity 112 in the Z direction. In the first and second frames 120 and 130, the outside of the first and second upper recesses 81 and 82 may overlap the reflective sidewall 110A or the side surfaces 111 of the cavity 112 in the vertical direction. A resin portion, for example, a portion of the body 115 may be coupled to the first and second upper recesses 81 and 82 of the first and second frames 120 and 130.

A portion of the body 115 disposed in the first and second upper recesses 81 and 82 may be exposed to the bottom reflector 113 of the cavity 112. A distance D5 between the outer regions of the first and second upper recesses 81 and 82 and the bottom of the side surface 111 of the cavity 112 may be at least 60 micrometers, for example, in the range of 60 to 150 micrometers. When the distance D5 is smaller than the range, a boundary portion between the upper mold frame and the frame is small during body injection molding, so that a portion of the body may not be filled to the bottom of the cavity 112, so that the bottom of the body may be provided to a uniform plane. When the distance D5 is larger than the range, the area of the portion of the body disposed on the bottom of the cavity may be reduced, thereby reducing the reflection efficiency.

As shown in FIG. 3, the distance D8 between the bottom reflector 113 and the body 115 is spaced at least 80 micrometers, for example, in a range of 80 to 150 micrometers, so that a degradation of rigidity between the body 115 and the frame may be prevented.

The first and second upper recesses 81 and 82 may be spaced apart from the through holes TH1, TH3, TH3, and TH4. Since the first and second upper recesses 81 and 82 are disposed not to overlap the through holes TH1, TH3, TH3, and TH4 in the third direction, so that the problem of the rigidity of the frames 120 and 130 may be prevented. As shown in FIGS. 2 and 3, the lower ends of the through holes TH1, TH3, TH3 and TH4 may be spaced apart from the upper recesses 81 and 82 at predetermined interval D4, and the interval D4 may be 80 micrometers or more, for example, in the range of 80 to 150 micrometers. Accordingly, when the through holes TH1, TH3, TH3, and TH4 are formed by the interval D4, the influences on the frames 120 and 130 may be prevented.

Portions corresponding to each other in the first frame 120 and the second frame 130 may be provided without a stepped structure or may be disposed with a stepped structure. Since the first frame 120 and the second frame 130 correspond to each other without a stepped structure, the rigidity of a portion of the frames in contact with the body may be secured, and when forming the through holes TH1, TH2, TH3, and TH4 or an ejecting the body, a damage to the frames may be prevented by the stepped structure. Therefore, since the region having the thickness of the frames 120 and 130 is provided at a predetermined distance around the through holes TH1, TH2, TH3, and TH4, the rigidity of the portion of the frames coupled with the body 115 may be secured. When the forming the through holes TH1, TH2, TH3, and TH4 or the ejecting the body, the impact transmitted to the frames 120 and 130 may be reduced.

At least one or both of the first and second frames 120 and 130 may include two or more through holes. Each of the first and second frames 120 and 130 may include a plurality of through holes TH1, TH3, TH3, and TH4. The first frame 120 may include a first through hole TH1 and a second through hole TH2, and the second frame 130 may include a third through hole TH3 and a fourth through hole TH4. The first to fourth through holes TH1, TH2, TH3, and TH4 may be holes penetrating from the top surface to the bottom surface of the frames 120 and 130, respectively.

The first to fourth through holes TH1, TH2, TH3, and TH4 may not overlap the body 115 in the vertical direction or the Z direction. The first to fourth through holes TH1, TH2, TH3, and TH4 may overlap the cavity 112 in the vertical direction, that is, in the Z direction.

The first and second through holes TH1 and TH2 may overlap the first light emitting device 151 in the vertical direction, for example, in the Z direction. As shown in FIGS. 1 and 3, the interval B1 between the first and second through holes TH1 and TH2 may be smaller than the length of the first light emitting device 151 in the X direction. An upper width (or diameter) of each of the first and second through holes TH1 and TH2 may be smaller than a width of the first light emitting device 151 in the Y direction.

The third and fourth through holes TH3 and TH4 may overlap the second light emitting device 153 in the vertical direction or the Z direction. As shown in FIGS. 1 and 3, the interval B1 between the third and fourth through holes TH3 and TH4 may be smaller than the length of the second light emitting device 153 in the X direction. An upper width (or diameter) of each of the third and fourth through holes TH3 and TH4 may be smaller than a width of the second light emitting device 153 in the Y direction. The interval B1 between the first and second through holes TH1 and TH2 and the interval B1 between the third and fourth through holes TH3 and TH4 may be smaller than an interval between the first and third through holes TH1 and TH3 and an interval between the second and fourth through holes TH2 and TH4. The interval B1 may vary depending on the size of the first and second light emitting devices 151 and 153 or the separation distance between the first and second light emitting devices 151 and 153.

<Body 115>

As shown in FIGS. 1 to 6, the body 115 may be connected to the reflective sidewall 110A. The body 115 may be integrally formed of the same material as the reflective sidewall 110A or may be formed of a separate material. When the body 115 and the reflective sidewall 110A are formed of different materials, the reflective sidewall 110A may be adhered or attached to the body 115. The reflective sidewall 110A may provide the cavity 112 which an upper portion is open. The first and second frames 120 and 130 may be disposed on the bottom reflector 113 of the cavity 112. The bottom reflector 113 and the first and second frames 120 and 130 may be disposed on the body 115. The side surface 111 of the cavity 112 may be formed as a surface perpendicular to or inclined with respect to the bottom reflector 113 of the body 115. In FIG. 3, the thickness between the bottom reflector 113 and the frames 120 and 130 may be the same.

The body 115 may be disposed between the first frame 120 and the second frame 130. The body 115 may perform a function of an electrode separation line. The body 115 may be referred to as an insulating member. The body 115 may be disposed in the second direction along the frames 120 and 130 to separate the adjacent first and second frames 120 and 130.

The body 115 may be disposed on the first and second frames 120 and 130. That is, the reflective sidewall 110A may provide a cavity therein and an inclined side surface 111 disposed on the first and second frames 120 and 130. The reflective sidewall 110A may be removed. The body 115 may be provided to have a flat top surface without the cavity 112.

For example, the body 115 may include at least one selected from the group consisting of Polyphthalamide (PPA), Polychloro triphenyl (PCT), liquid crystal polymer (LCP), polyamide 9T (PA9T), silicone, epoxy molding compound (EMC), silicon molding compound (SMC), ceramic, photo sensitive glass (PSG), sapphire (Al2O3) and the like. In addition, the body 115 may include high refractive fillers such as TiO2 and SiO2. The reflective sidewall 110A may be formed of a material of the body 115 or may be formed of another material among the materials.

The bottom reflector 113 of the body 115 may extend on the first and second upper recesses 81 and 82 to extend to the bottom of the cavity 112. The bottom reflector 113 may be disposed on the same plane as the top surfaces of the flat portions 122 and 132. The bottom reflector 113 may reflect light around the light emitting devices 151 and 153. The first and second upper recesses 81 and 82 and the bottom reflector 113 are disposed around the through holes TH1, TH3, TH3, and TH4, and the reflected light through a lateral direction of the light emitting devices 151 and 153 may reflect by the first and second upper recesses 81 and 82 and the bottom reflector 113.

<Light Emitting Devices 151 and 153>

Referring to FIGS. 1, 4, and 5, the light emitting devices 151 and 153 may include first and second light emitting devices 151 and 153. Each of the first and second light emitting devices 151 and 153 may include first and second bonding portions 51, 52, 61, and 62 and light emitting portions 50 and 60. The light emitting portions 50 and 60 are disposed on the first and second bonding portions 51, 52, 61, and 62 to emit light. The first and second bonding portions 51, 52, 61, and 62 may be disposed under the light emitting portions 50 and 60, and may be electrodes or/and electrode pads. The first and second bonding portions 51, 52, 61, and 62 may be electrically connected to the first and second frames 120 and 130. An intervals between the center portions of the first and second bonding portions 51, 52, 61, and 62 may be smaller than the interval B1 between the center portions of the first and second through holes TH1 and TH2, and the interval between the center portions of the third and third through holes TH3 and TH4.

The first bonding portion 51 of the first light emitting device 151 may overlap the first through hole TH1 in the third direction, and the second bonding portion 52 of the first light emitting device 151 may overlap the second through hole TH2 in the third direction. An area of lower surfaces of the first and second bonding portions 51 and 52 of the first light emitting device 151 may be larger than an area of upper surfaces of the first and second through holes TH1 and TH2. The first bonding portion 51 of the first light emitting device 151 faces or overlaps the first through hole TH1 and the first frame 120 in the third direction, and the second bonding portion 52 of the first light emitting device 151 may face or overlap the second through hole TH2 and the second frame 130 in the third direction.

A conductive layer 321 may be disposed in the first and second through holes TH1 and TH2. The first and second bonding portions 51 and 52 of the first light emitting device 151 may be adhered to the conductive layers 321 disposed in the first and second through holes TH1 and TH2 and may be bonded to the first and second frames 120 and 130. The first light emitting device 151 may be electrically connected to the first and second frames 120 and 130. The first light emitting device 151 may be electrically connected to the first and second frames 120 and 130 through the conductive layer 321 disposed in the first and second through holes TH1 and TH2.

The third bonding portion 61 of the second light emitting device 153 may overlap the third through hole TH3 in the third direction, and the fourth bonding portion 62 of the second light emitting device 153 may overlap the fourth through hole TH4 in the third direction. An area of lower surfaces of the third and fourth bonding portions 61 and 62 of the second light emitting device 153 may be larger than an area of upper surfaces of the third and fourth through holes TH3 and TH4. The third bonding portion 61 of the second light emitting device 153 faces or overlaps the third through hole TH3 and the flat portion 122 of the first frame 120 in the third direction. The fourth bonding portion 62 of the second light emitting device 153 may face or overlap the fourth through hole TH4 and the flat portion 132 of the second frame 130 in the third direction.

A conductive layer 321 may be disposed in the third and fourth through holes TH3 and TH4. The third and fourth bonding portions 61 and 62 of the second light emitting device 151 may be adhered to the conductive layers 321 disposed in the third and fourth through holes TH3 and TH4 and may boned to the first and second frames 120 and 130. The second light emitting device 153 may be electrically connected to the first and second frames 120 and 130. The second light emitting device 153 may be electrically connected to the first and second frames 120 and 130 through the conductive layers 321 disposed in the third and fourth through holes TH3 and TH4.

The light emitting portions 50 and 60 of the first and second light emitting devices 151 and 153 may include a semiconductor layer and may emit at least one of blue, green, red, ultraviolet, and infrared rays. The semiconductor layer may include a first conductive semiconductor layer, an active layer, and a second conductive semiconductor layer, and may include at least one of an n-p junction, a p-n junction, an n-p-n junction, and a p-n-p junction. The semiconductor layer may include a compound semiconductor of group II to VI elements, and may include, for example, a compound semiconductor layer of group III and V elements or a compound semiconductor layer of group II and VI elements. For example, the semiconductor layer may include at least two elements selected from aluminum (Al), gallium (Ga), indium (In), phosphorus (P), arsenic (As), and nitrogen (N). The first bonding portions 51 and 61 may be connected to any one of the first conductive semiconductor layer and the second conductive semiconductor layer, and the second bonding portions 52 and 62 may be connected to the other. The light emitting portions 50 and 60 may emit the same peak wavelengths or emit different peak wavelengths through the light emitting devices 151 and 153. The light emitting portions 50 and 60 of the first and second light emitting devices 151 and 153 may include a substrate thereon, and the substrate may include a transparent material and may be disposed on the semiconductor layer.

In the light emitting portions 50 and 60, the first and second conductive semiconductor layers may be implemented as at least one of a compound semiconductor of Group III-V elements or Group II-VI elements. The first and second conductive semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductive semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductive semiconductor layer may be an n-type semiconductor layer doped with an n-type dopant such as Si, Ge, Sn, Se, Te, or the like. The second conductive semiconductor layer may be a p-type semiconductor layer doped with p-type dopants such as Mg, Zn, Ca, Sr, and Ba.

The active layer may be implemented with a compound semiconductor. The active layer may be implemented as at least one of a compound semiconductor of Group III-V or Group II-VI, for example. When the active layer is implemented in a multi-well structure, the active layer may include a plurality of well layers and a plurality of barrier layers that are alternately arranged, and may disposed of a semiconductor material having a composition formula of $In_xAl_yGa_{1-x-y}N$ ($0 \leq x \leq 1$, $0 \leq y \leq 1$, $0 \leq x+y \leq 1$). For example, the active layer may include at least one selected from the group comprising InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs.

The first light emitting device 151 may emit a first blue wavelength, and the second light emitting device 153 may emit a second blue wavelength. The first blue wavelength may be light of 440 nm or less, and the second blue wavelength may be light of 460 nm or more. The first and second blue wavelength difference may be provided with a difference of 20 nm or more, and the wavelength difference may improve the color rendering index (CRI), for example, to provide a color rendering index of R1-R5 to 95 or more. Therefore, a package capable of high color reproduction may be provided.

The first to fourth bonding portions 51, 52, 61, and 62 may be formed in a single layer or multiple layers using one or more materials or alloys of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO. Each of the frames 120 and 130 and the bonding portions 51, 52, 61, and 62 may be compounded by an intermetallic compound layer. The intermetallic compound may include at least one of $Cu_xSn_y$, $Ag_xSn_y$, and $Au_xSn_y$, where the x may satisfy a condition of $0<x<1$, $y=1-x$, $x>y$. The bonding portions 51, 52, 61, and 62 of the light emitting devices 151 and 153 may be formed with an intermetallic compound (IMC) layer formed between the conductive layer 321 and the frames 120 and 130 by a forming process the conductive layer 321 or a heat treatment process after the conductive layer 321 is provided and the material constituting the conductive layer 321. The conductive layer 321 may include one material selected from the group including Ag, Au, Pt, Sn, Cu, or an alloy thereof. However, the present invention is not limited thereto, and a material capable of securing a conductive function may be used as the conductive layer 321. For example, the conductive layer 321 may be formed using a conductive paste. The conductive paste may include a solder paste, a silver paste, or the like, and may include a multilayer or a single layer composed of a multilayer or an alloy composed of different materials. For example, the conductive layer 321 may include a SAC (Sn—Ag—Cu) material.

For example, an alloy layer may be formed by bonding between a material forming the conductive layer 321 and a metal of the frames 120 and 130. Accordingly, the conductive layer 321 and the frames 120 and 130 may be physically and electrically coupled stably. The conductive layer 321, the alloy layer, and the frame may be physically and electrically coupled stably. The alloy layer may include at least one intermetallic compound layer selected from the group including AgSn, CuSn, AuSn, and the like. The intermetallic compound layer may be formed by combining a first material and a second material, the first material may be provided from the conductive layer 321, and the second material may be the bonding portions 51, 52, 61, and 62, or may be provided from the frames 120 and 130.

The light emitting devices 151 and 153 according to the embodiment may be connected in parallel to each other on the first and second frames 120 and 130.

Referring to FIG. 1, the interval G1 of the first and second light emitting devices 151 and 153 may be in a range of 300 micrometers or more, for example, 300 to 800 micrometers, and when smaller than the range, optical interference between each other may occur. If it is larger than the above range, the brightness improving effect may be insignificant and the package size may be increased.

<Molding Portion 180>

Referring to FIGS. 4 to 6, the light emitting device package 100 according to the embodiment may include a molding portion 180. The molding portion 180 may be provided on the light emitting devices 151 and 153. The molding portion 180 may be disposed on the first and second frames 120 and 130. The molding portion 180 may be disposed in the cavity 112 provided by the package body 110.

The molding portion 180 may include an insulating material. In addition, the molding portion 180 may include wavelength conversion means for receiving light emitted from the light emitting devices 151 and 153 and providing wavelength converted light. As an example, the molding portion 180 may be at least one selected from the group including phosphors, quantum dots, and the like. The light emitting devices 151 and 153 may emit light of blue, green, red, white, infrared or ultraviolet light. The phosphor or quantum dot may emit light of blue, green, and red. The molding portion 180 may not be formed. The molding portion 180 may include phosphors that emit the same or different red peak wavelengths, but is not limited thereto.

<Through Hole TH1, TH2, TH3, and TH4 of the Body>

As shown in FIGS. 2 to 4, the light emitting device package 100 according to the embodiment may include a plurality of through holes TH1, TH2, TH3, and TH3. At least one of the plurality of through holes TH1, TH2, TH3, and TH3 may be disposed under each of the light emitting devices 151 and 153. The first frame 120 may include the first through hole TH1 and the third through hole TH3. The second frame 130 may include the second through hole TH2 and the fourth through hole TH4.

The first to fourth through holes TH1, TH2, TH3, and TH4 may be provided in one or a plurality of frames 120 and 130. The first to fourth through holes TH1, TH2, TH3, and TH4 may be provided through the frames 120 and 130. The first to fourth through holes TH1, TH2, TH3, and TH4 may be provided through the upper and lower surfaces of the frames 120 and 130 in the third direction.

The first through hole TH1 may be disposed to face the lower surface of the first bonding portion 51 of the first light emitting device 151, and the second through hole TH2 may be disposed to face the lower surface of the second bonding portion 52. The third through hole TH3 may be disposed to face the lower surface of the third bonding portion 53 of the second light emitting device 153, and the fourth through hole TH4 may be disposed to face the lower surface of the fourth bonding portion 54 of the second light emitting device 153.

The first through hole TH1 and the second through hole TH2 may be spaced apart from each other. The first through hole TH1 and the second through hole TH2 may be spaced apart from each other under the first light emitting device 151. The first through hole TH1 and the second through hole TH2 may be disposed in a region overlapping with the first light emitting device 151 in the vertical direction and spaced apart from the body 115.

The third through hole TH3 and the fourth through hole TH4 may be spaced apart from each other. The third through hole TH3 and the fourth through hole TH4 may be spaced apart from each other under the second light emitting device 153. The third through hole TH3 and the fourth through hole TH4 may be disposed in a region overlapping with the second light emitting device 153 in the vertical direction and spaced apart from the body 115.

The depths of the through holes TH1, TH2, TH3, and TH4 may be the same as the thicknesses of the frames 120 and 130. The depth of each of the through holes TH1, TH2, TH3, and TH4 may be provided to a depth capable of maintaining stable strength of each of the frames 120 and 130. For example, the depth of each through hole TH1, TH2, TH3, TH4 may be provided in a range of 180 micrometers or more, for example, 180 to 220 micrometers.

In example embodiments, the width of the upper region of each of the through holes TH1, TH2, TH3, and TH4 in the first and second directions X and Y may be less than or equal to the width of the lower region. The width of the upper region of each of the through holes TH1, TH2, TH3, and TH4 may be the same in the first and second directions, or the width in the first direction may be larger than the width in the second direction. The widths of upper regions of the through holes TH1, TH2, TH3, and TH4 in the first and second directions may be provided smaller or equal to a length of the lower surface of each of the bonding portions 51, 52, 61 and 62 facing to each of through holes TH1, TH2, TH3, and TH4. An upper area of each of the through holes TH1, TH2, TH3, and TH4 may be smaller than an area of the lower surface of each of the bonding portions 51, 52, 61, and 62. Each of the through holes TH1, TH2, TH3, and TH4 may not be exposed to the outside of each of the bonding portions 51, 52, 61, and 62. Each of the through holes TH1, TH2, TH3, and TH4 may have a circular shape or a polygonal shape. Each of the through holes TH1, TH2, TH3, and TH4 may have the same shape as or a different shape from the lower surface of each of the bonding portions 51, 52, 61, and 62. The bonding portions 51, 52, 61, and 62 may have a circular shape or a polygonal shape, but the present invention is not limited thereto.

Since the area of the upper surfaces of the through holes TH1, TH2, TH3, and TH4 are smaller than that of the bonding portions 51, 52, 61, and 62 of the light emitting devices, the conductive layers 321 disposed in the through holes TH1, TH2, TH3 and TH4 may prevent from leaking to the outside of each of the bonding portions 51, 52, 61, and 62.

An upper area of each of the through holes TH1, TH2, TH3, and TH4 may have a range of 30% or more, for example, 30% to 98% of an area of the lower surface of each of the bonding portions 51, 52, 61, and 62. Each of the through holes TH1, TH2, TH3, and TH4 and each of the bonding portions 51, 52, 61, and 62 may have a non-overlapping region that does not face a partially facing region.

The distance from the upper regions of the through holes TH1, TH2, TH3, and TH4 to the side ends of the bonding portions 51, 52, 61, and 62 in the X direction may be 40 micrometers or more, for example, in a range of 40 to 60 micrometers. When the distance is 40 micrometers or more, a process margin may be secured so that the bonding portions 51, 52, 61, and 62 are not exposed at the bottom of the through holes TH1, TH2, TH3, and TH4. When the distance is less than 60 micrometers, the area of each of the bonding portions 51, 52, 61, and 62 exposed to the through holes TH1, TH2, TH3, and TH4 may be secured, and a resistance of each of the bonding portions 51, 52, 61, and 62 exposed by the through holes TH1, TH2, TH3, and TH4 may be lowered. In addition, current injection efficiency may be improved through each of the bonding portions 51, 52, 61, and 62 exposed by the through holes TH1, TH2, TH3, and TH4.

Each of the through holes TH1, TH2, TH3, and TH4 may have a shape in which the width or diameter gradually decreases toward the upper direction. In the modified examples of the through holes, as a first example, the side surface of the through hole is formed to be curved, so that the width or diameter may gradually become smaller toward the upper direction. As a second example, the side surface of the through hole may be formed as a vertical surface, so that the upper and lower portions may have the same width or diameter. As a second example, the side surfaces of the through holes are formed to be inclined at different angles, so that the upper width or diameter is smaller than the lower width or diameter. As a fourth example, the side surface of the through hole may be formed as a curved surface having a different curvature, the radius of curvature of the lower side may be larger than the radius of curvature of the upper side. As the fourth example, the curved surface may be a single curved surface or a hyperbolic surface. The curved surface may be a curved surface that is convex outward from the center of the through hole. The through holes TH1, TH2, TH3, and TH4 according to the embodiment may be formed on at least some side surfaces or side surfaces facing each other with the shape of the side surface, or may be formed on all side surfaces with the shape of the side surface.

<Conductive Layer 321>

As shown in FIGS. 4 to 6, the light emitting device package 100 according to the embodiment may include a conductive layer 321. The conductive layer 321 may be provided in at least one or both of the plurality of through holes TH1, TH2, TH3, and TH4. The conductive layer 321 may be disposed under the bonding portions 51, 52, 61, and 62 of the light emitting devices 151 and 153. The width of the conductive layer 321 in the first direction X and the second direction Y may be smaller than the width of each of the bonding portions 51, 52, 61, and 62. The conductive layer 321 may be provided when the light emitting device is mounted on the circuit board. The conductive layer 321 may be disposed between the light emitting device package 100 and the circuit board and filled in each of the through holes TH1, TH2, TH3, and TH4.

The conductive layer 321 may be in direct contact with the lower surfaces of the bonding portions 51, 52, 61, and 62. The conductive layer 321 may be electrically connected to each of the bonding portions 51, 52, 61, and 62. Each of the frames 120 and 130 may be disposed around the conductive layer 321 and may be connected to each of the frames 120 and 130.

The conductive layer 321 may include one material selected from the group consisting of Ag, Au, Pt, Sn, Cu, Zn, In, Bi, Ti, or an alloy thereof. The conductive layer 321 may be a material that may ensure the function of electrical conductivity. The conductive layer 321 may include a solder paste or Ag paste, and may be formed, for example, by mixing powder particles or particle particles with flux. The solder paste may include, for example, Sn—Ag—Cu. For example, the conductive layer 321 may be formed of a multilayer or a single layer composed of a multilayer or an alloy composed of different materials.

In the light emitting device package 100 according to the embodiment, power may be connected to the first and second bonding portions 51 and 52 of the first light emitting device 151 through the conductive layer 321 disposed in the first through hole TH1 and the second through hole TH2, and power may be connected to the third and fourth bonding portions 61 and 62 of the second light emitting device 153 through the conductive layer 321 disposed in the third through hole TH3 and the fourth through hole TH4. When the first and second frames 120 and 130 are made of a conductive material, the first and second frames 120 and 130 may be electrically connected to the bonding portions 51, 52, 61, and 62 of the light emitting devices 151 and 153. The bonding portions 51, 52, 61, and 62 of the light emitting devices 151 and 153 may be electrically connected to at least one or both the conductive layers 321 and 322 and the frames 120 and 130. Accordingly, the light emitting devices 151 and 153 may be driven by driving power supplied through the bonding portions 51, 52, 61, and 62. In addition, the light emitted from the light emitting devices 151 and 153 may be provided in an upper direction of the package body 110.

Frames 120 and 130 according to the embodiment may be a multi-layer structure, it may be arranged in a laminated structure including a base layer and a plating layer on the base layer. The base layer may include at least one of Cu, Ni, and Ti, and the plating layer may include at least one of Au, Ni, and Ag. When the plating layer includes the Ni layer, since the Ni layer has a small change in thermal expansion, light emission disposed on the upper portion by the Ni layer even when the package body is changed in size or arrangement position by thermal expansion. The position of the device may be fixed stably by the Ni layer. When the plating layer includes an Ag layer, the Ag layer may efficiently reflect light emitted from the light emitting device disposed above and improve luminous intensity.

An alloy layer may be formed between the conductive layer 321 and the frames 120 and 130. The alloy layer may be formed by bonding between a material constituting the conductive layer 321 and metal layers of the frames 120 and 130. The alloy layer may be formed on the surfaces of the through holes of the frames 120 and 130. The alloy layer may include at least one intermetallic compound layer selected from the group including AgSn, CuSn, AuSn, and the like. The intermetallic compound layer may be formed by combining a first material and a second material, the first material may be provided from the conductive layer 321, and the second material may be provided from a base layer or a plating layer of the frames 120 and 130. When the conductive layer 321 includes a Sn material and the plating layer includes an Ag material, an intermetallic compound layer of AgSn may be formed by bonding Sn material and Ag material in a process in which the conductive layer 321 is provided or a heat treatment after being provided.

Alternatively, when the conductive layer 321 includes a Sn material and the plating layer includes an Au material, an intermetallic compound layer of AuSn may be formed by a combination of the Sn material and the Au material in a process in which the conductive layer 321 is provided or a heat treatment after being provided.

Alternatively, when the conductive layer 321 includes a Sn material and the base layers of the frames 120 and 130 include a Cu material, an intermetallic compound layer of CuSn may be formed by a combination of the Cu material and the Sn material in the process in which the conductive layer 321 is provided or a heat treatment after the heat treatment being provided.

Alternatively, when the conductive layer 321 includes an Ag material and some layers of the frames 120 and 130 include a Sn material, an intermetallic compound layer of AgSn may be formed by a combination of the Ag material and the Sn material in the process in which the conductive layer 321 is provided or a heat treatment after the heat treatment being provided.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 and the light emitting device package manufacturing method of an embodiment, the package body 110 does not need to be exposed to a high temperature in the process of manufacturing a light emitting device package. Therefore, according to the embodiment, the package body 110 may be prevented from being exposed to high temperatures to be damaged or discolored. Accordingly, the selection range for the material constituting the body 115 may be widened. According to an embodiment, the body 115 may be provided by using a relatively inexpensive resin material as well as an expensive material such as ceramic.

As shown in FIG. 3, a minimum distance between the first through hole TH1 and the second through hole TH2 in a lower surface region of the first frame 120 and the second frame 130 may be 100 micrometers or more, for example, 100 micrometers to 150 micrometers. The minimum distance between the third through hole TH3 and the fourth through hole TH4 in the lower region of the third frame 134 and the fourth frame 140 may be 100 micrometers or more, for example, 100 micrometers to 150 micrometers. The interval between the through holes TH1, TH2, TH3, and TH4 may be a minimum distance for preventing electrical short between the electrodes when the light emitting device package 100 is mounted on a circuit board or a sub-mount. The minimum interval may vary depending on the positions of the bonding portions of the light emitting devices 151 and 153, but is not limited thereto.

<Recesses R1, R2, R3, and R4 of the Body>

As shown in FIGS. 1 to 5, the light emitting device package 100 according to the embodiment may include recesses R1, R2, R3, and R4. The recesses R1 and R2 may be provided at an upper portion of the body 115. The plurality of recesses R1, R2, R3, and R4 may be spaced apart from each other. In the recesses R1, R2, R3, and R4, a first recess R1 and a second recess R2 are disposed under the first light emitting device 151, and a third and fourth recesses R3 and R4 may be disposed under the second light emitting device 153.

As shown in FIGS. 2 and 3, the interval D1 between the first and second recesses R1 and R2 may be smaller than a length in the second direction or a short side of the first light emitting device 151. At least a portion of the first and second recesses R1 and R2 may be disposed to overlap the first light emitting device 151 in the third direction or the vertical direction. The first resin 160 may be disposed in the first and second recesses R1 and R2. The first resin 160 may be disposed between the first and second frames 120 and 130 and the first light emitting device 151. Here, after dispensing the first resin 160 in a region between the first and second recesses R1 and R2, the first light emitting device 151 is aligned on the first and second through holes TH1 and TH2, and are pressed in the directions of the first and second frames 120 and 130. In this case, the first resin 160 is spread as shown in FIG. 7, and a portion of the first resin 160 is moved to the first and second recesses R1 and R2 and filled. The first resin 160 may be attached to the first and second bonding portions 51 and 52 of the first light emitting device 151, or may be formed on the flat portion 122 and 132 around the first and second through holes TH1 and TH2. Each of the first and second recesses R1 and R2 may be smaller or larger than a region where the first and second recesses R1 and R2 overlap with each other.

The first and second recesses R1 and R2 may be disposed in the second direction and may be spaced in a direction orthogonal to the first direction in which the first and second through holes TH1 and TH2 are spaced apart from each other. The first and second recesses R1 and R2 may be disposed on the same line or on different lines. The first and second recesses R1 and R2 may be spaced apart in the short side direction of the first light emitting device 151.

An interval D1 between the third and fourth recesses R3 and R4 may be smaller than a length of a second side or a short side of the second light emitting device 153. In addition, at least a portion of the third and fourth recesses R3 and R4 may be disposed to overlap the second light emitting device 153 in the third direction or the vertical direction. This is because after dispensing the second resin 162 in the region between the third and fourth recesses R3 and R4, the second light emitting device 153 is disposed in the third and fourth through holes TH3 and TH4 and is pressed in the direction of the first and second frames 120 and 130. In this case, the second resin 162 is spread as shown in FIG. 7, and a portion of the second resin 162 is moved to the third and fourth recesses R3 and R4 to be filled. In this case, the second resin 162 may be attached to the third and fourth bonding portions 61 and 62 of the second light emitting device 153, or may be formed on the flat portion 122 and 132 around the third and fourth through holes TH3 and TH4. In each of the third and fourth recesses R3 and R4, a region overlapping with the second light emitting device 153 may be smaller or larger than a region in which the second light emitting device 153 does not overlap.

The third and fourth recesses R3 and R4 may be disposed in the second direction and may be spaced in a direction orthogonal to the first direction in which the third and fourth through holes TH3 and TH4 are spaced apart from each other. The third and fourth recesses R3 and R4 may be disposed on the same line or on different lines. The third and fourth recesses R3 and R4 may be spaced apart in the short side direction of the second light emitting device 153.

In the first to fourth recesses R1, R2, R3, and R4, the lengths B2 and B3 in the second direction Y may be larger than the widths in the first direction X. The lengths B2 and B3 may be less than 50% of the short sides of the light emitting devices 151 and 153. The first to fourth recesses R1, R2, R3, and R4 may be disposed between the first frame 120 and the second frame 130. The inside of the first and second recesses R1 and R2 may overlap the first and second through holes TH1 and TH2 in the first direction, and the outside of the first and second recesses R1 and R2 may not be overlapped with the first and second through holes TH1 and TH2 in the first direction. The inside of the third and fourth recesses R3 and R4 may overlap the third and fourth through holes TH3 and TH4 in the first direction, and the outside of the third and fourth recesses R3 and R4 may not be overlapped with the third and fourth through holes TH3 and TH4 in the first direction.

In each of the first to fourth recesses R1, R2, R3, and R4, a length B2 and B3 in the second direction smaller than the length of the short sides or the length in the second direction of the light emitting devices 151 and 153. The lengths B2 and B3 of the two adjacent recesses R1, R2, R3, and R4 may be the same or different from each other.

The first to fourth recesses R1, R2, R3, and R4 may have a width in the first direction smaller than an interval between the first and second frames 120 and 130 or a width of the body 115 between the first and second frames 120 and 130.

The recesses R1, R2, R3, and R4 may be recessed in a direction of the lower surface from an upper surface of the body 115. The depths of the first and second recesses R1, R2, R3, and R4 may be smaller than the depths of the through holes TH1, TH2, TH3, and TH4. The depths of the first and second recesses R1, R2, R3, and R4 may be 40% or more, for example, in the range of 40% to 60% of the thickness of the body 115. When the depths of the first and second recesses R1, R2, R3, and R4 are smaller than the above ranges, the amount of the first resins 160 and 162 may be reduced, so that the improvement of the bearing capacity of the light emitting devices 151 and 153 may be insignificant.

The depths of the recesses R1, R2, R3, and R4 may be determined in consideration of the adhesive force of the first resins 160 and 162. In addition, the depths of the recesses R1, R2, R3, and R4 may be determined by taking into consideration the stable strength of the body 115 and/or preventing the light emitting device package 100 from being cracked due to the heat emitted from the light emitting device 151 and 153.

The insides of the recesses R1, R2, R3, and R4 may overlap each of the light emitting devices 151 and 153 in the Z direction, and outsides thereof may not be overlapped with the light emitting devices 151 and 153 in the Z direction. For example, the depths of the recesses R1, R2, R3, and R4 are considered to be an injection process thickness capable of providing crack free of the body 115. In some embodiments, the ratio of the depths of the recesses R1, R2, R3, and R4 to the depths of the through holes TH1, TH2, TH3, and TH4 may be provided as 2 to 10. For example, when the depth of the through holes TH1, TH2, TH3, TH4 may be provided at 200 micrometers, the depth of the recesses R1, R2, R3, R4 may be provided at 20 micrometers to 100 micrometers.

The recesses R1, R2, R3, and R4 may provide appropriate spaces under the light emitting devices 151 and 153 to perform an underfill process. The underfill process may be a process of disposing the light emitting devices 151 and 153 on the body 115 and then disposing the first resins 160 and 162 under the light emitting devices 151 and 153, and may be a process of disposing the light emitting devices 151 and 153. In the process of mounting the light emitting devices 151 and 153 on the body 115, the underfill process may be a process of disposing the light emitting devices 151 and 153 after the first resins 160 and 162 are disposed in the recesses R1, R2, R3 and R4 to mount the first resins 160 and 162. The recesses R1, R2, R3, and R4 may be provided at a predetermined depth or more so that the first resins 160 and 162 may be sufficiently provided between the lower surfaces of the light emitting devices 151 and 153 and the upper surface of the body 115. In addition, the recesses R1, R2, R3, and R4 may be provided at a predetermined depth to provide stable strength of the body 115. For example, the depths of the recesses R1, R2, R3, and R4 may be provided in a range of 40 micrometers or more, for example, in the range of 40 to 60 micrometers. The width of the recesses R1, R2, R3, and R4 in the second direction may be provided in a range of 140 micrometers or more, for example, 140 to 160 micrometers. The lengths of the recesses R1, R2, R3, and R4 in the first direction may be larger or smaller than the lengths of the light emitting devices 151 and 153 in the Y direction, thereby guiding the formation of the first resins 160 and 162 and a strengthen the adhesion in the direction.

As shown in FIG. 2, the distance D3 between two adjacent recesses R2 and R3 disposed under different light emitting devices 151 and 153 may be smaller than the interval between the light emitting devices 151 and 153.

Here, one light emitting device or two or more light emitting devices 151 and 153 may be disposed in the cavity 112, and the two or more light emitting devices 151 and 153 may be connected in series or in parallel. The modified example of the recess of the body at the bottom of the cavity of the light emitting device package may be variously changed, and as an example, the example of FIGS. 8 to 16 will be described.

As shown in FIG. 8, a recess Ra overlapping in the Z direction may be disposed under the light emitting devices 151 and 153, and the length of the recess Ra may be smaller than the length of the light emitting devices 151 and 153 in the Y direction. The recess Ra may not be exposed to the outside of the light emitting devices 151 and 153. Although FIG. 8 illustrates the top view shape of the recess Ra as an example of the polygon, the elliptical recess Ra1 may be provided as shown in FIG. 9.

As shown in FIG. 10, recesses Ra2 overlapping in the Z direction may be disposed under the light emitting devices 151 and 153, and the length of the recesses Ra2 may be smaller than the length of the light emitting devices 151 and 153 in the Y direction. The inner region of the recess Ra2 may not be exposed to the outside of the light emitting devices 151 and 153, and the outer region thereof may be exposed. The recess Ra2 may be exposed to a portion adjacent to the side of the cavity.

As shown in FIG. 11, a plurality of recesses Rb overlapping in the Z direction may be disposed under the light emitting devices 151 and 153, and a length of each of the plurality of recesses Rb may be less than half of the length of the light emitting devices 151 and 153 in the Y direction. The plurality of recesses Rb may not be exposed to the outside of the light emitting devices 151 and 153. The plurality of recesses Rb may overlap the through holes TH1 and TH2 in the X direction.

As shown in FIG. 12, a plurality of recesses Rd may be disposed under the light emitting devices 151 and 153, and at least a portion of the recesses Rd overlap the light emitting devices 151 and 153. A length of each of the plurality of recesses Rd may be less than the length of the light emitting devices 151 and 153 in the Y direction. An inner region of each recess Rd may not be exposed to the outside of the light emitting devices 151 and 153, and an outer region of the recess Rd may be exposed. The recess Rd may include a region that does not overlap the through holes TH1 and TH2 in the X direction. The plurality of recesses Rd may be disposed to be offset from each other in the Y direction, that is, one may be adjacent to the first frame 120 and the other may be adjacent to the second frame 130. The plurality of recesses Rc may have the same size.

As shown in FIG. 13, two or more recesses Rc may be disposed, and one of them may have a different size. For example, the size of the center side recess among three or more recesses Rc may be smaller than the size of the other recesses. For example, the size may have a length in the Y direction smaller than that of the others. In addition, the center side recess overlaps the light emitting devices 151 and 153 in the Z direction, and the other two recesses may have an outer region protrude outward from the light emitting devices 151 and 153.

As shown in FIG. 14, the center side recess Rc2 of the plurality of recesses Rc may be disposed at a long length in the X direction, and the other two or more may be disposed at a long length in the Y direction.

As shown in FIG. 15, the center side recess Rc3 may have another shape among the plurality of recesses Rc. The recesses of the others may be polygonal in shape.

As shown in FIG. 16, the plurality of recesses Rd1 may be disposed on different lines rather than the same line in the Y direction. For example, one may be adjacent to the first frame 120, the opposite recess is adjacent to the third frame 130, and the center side recess may be disposed in the middle portion.

As shown in FIGS. 8 and 9, two recesses overlapping the light emitting devices 151 and 153 in the Z direction are disposed as described above, but embodiments are not limited thereto. That is, there may be one recess overlapping the light emitting devices 151 and 153 in the Z direction. The recess may be smaller than the width of the light emitting devices 151 and 153 in the Y direction. Therefore, the entire region of the recess may overlap with the light emitting device in the Z direction because it does not extend to the outside of the light emitting device.

However, the present invention is not limited thereto, and as shown in FIGS. 10, 12, 13, and 16, at least a portion of the recess vertically overlapping the light emitting devices 151 and 153 is disposed, or one of the plurality of recesses may extend to the outside of the light emitting devices 151 and 153. When the recess extends to the outside of the light emitting device, the width of the recess in the direction of the recess is shorter than the width of the Y direction of the light emitting devices 151 and 153 so that the recess may extend outside to one of both outer sides of the light emitting devices 151 and 153.

In addition, the recess may be two or more, that is, a plurality of recesses are spaced apart from each other. Since the plurality of recesses have a width in the Y direction smaller than the width in the Y direction of the light emitting device as described above, the region overlapping the light emitting devices 151 and 153 in the Z direction may be the entire reigio. However, the present invention is not limited thereto and may have a recess extending to at least one outer surface of the plurality of outer surfaces of the light emitting devices 151 and 153. In addition, the plurality of recesses may be spaced apart in the X direction, and may be spaced apart in the Y direction, which is a direction perpendicular to the first direction.

<First Resin 160 and 162>

As shown in FIGS. 4 to 7, the light emitting device package 100 may include first resins 160 and 162. The first resins 160 and 162 may be disposed between the body 115 and the light emitting devices 151 and 153. The first resins 160 and 162 may be disposed between the lower surface of the body 115 and the lower surface of the light emitting devices 151 and 153. The first resins 160 and 162 may overlap the light emitting devices 151 and 153 in the Z-axis direction perpendicular to the light emitting devices 151 and 153. The first resins 160 and 162 may be attached to the light emitting devices 151 and 153 and the body 115. The first resins 160 and 162 may be disposed between the bonding portions 51, 52, 61, and 62 of the light emitting devices 151 and 153. The first resin 160 disposed in the first recess R1 is disposed between the first and second bonding portions 51 and 52, and may be contacted the first and second bonding portions 51 and 52 and the lower surface of the first light emitting device 151. The first resin 162 disposed in the second recess R2 is disposed between a lower surface of the second light emitting device 153 and the third and fourth boding portions 61 and 62, and may be contacted the third and fourth bonding portions 61 and 62.

The first resins 160 and 162 may be disposed in the recesses R1, R2, R3, and R4. The first resins 160 and 162 may provide a stable fixing force between the light emitting devices 151 and 153 and the package body 110 and/or the body 115. The first resins 160 and 162 may provide a stable fixing force between the light emitting devices 151 and 153 and the body 115. For example, the first resins 160 and 162 may be disposed in direct contact with the upper surface of the body 115. In addition, the first resins 160 and 162 may be disposed in direct contact with lower surfaces of the light emitting devices 151 and 153.

For example, the first resins 160 and 162 may include at least one of an epoxy-based material, a silicone-based material, a hybrid material including an epoxy-based material and a silicon-based material. As another example, when the first resins 160 and 162 include a reflective function, the first resin may include a metal oxide such as white silicone. The first resins 160 and 162 may be formed of a material different from that of the molding portion, or may include a different kind impurities (e.g., a metal oxide) from impurities (e.g., a phosphor) that may be added to the molding portion. The first resins 1601 and 62 may be adhesives.

When light is emitted to the lower surfaces of the light emitting devices 151 and 153, the first resins 160 and 162 may provide a light diffusion function between the light emitting devices 151 and 153 and the body 115. When light is emitted from the light emitting devices 151 and 153 to the lower surfaces of the light emitting devices 151 and 153, the first resins 160 and 162 may provide a light diffusing function to improve light extraction efficiency of the light emitting device package 100. In addition, the first resins 160 and 162 may reflect light emitted from the light emitting devices 151 and 153. When the first resins 160 and 162 include a reflection function, the first resins 160 and 162 may be made of a material including a metal oxide or impurities such as TiO2, Silicone, and Al2O3.

In the light emitting device package 100 according to the embodiment, an optical lens or an optical member may be disposed on an upper portion thereof. The optical lens may change the direction of incidence of the incident light, and the optical member may include a light guide plate or a prism sheet on the coated plate to provide a surface light source.

The embodiment may improve the supporting force of the light emitting devices 151 and 153. As shown in FIGS. 2 and 4, each of the light emitting devices 151 and 153 may be adhered to each other by the recesses R1, R2, R3 and R4 and the first resins 160 and 162 between the first and second frames 120 and 130. The first resins 160 and 162 may support the light emitting devices 151 and 153, and may support the flow of the light emitting devices 151 and 153 due to external factors.

FIG. 17 is a modified example of FIG. 4, and may include an inner wall portion 117 in the cavity 112.

Referring to FIG. 17, the inner wall portion 117 may be formed on the body 115. The inner wall portion 117 may be disposed to be elongated in the first direction along the light emitting devices 151 and 153. The maximum length of the inner wall portion 117 in the first direction may be longer than the bottom length of the cavity 112. The inner wall portion 117 may have a width in the second direction of 200 micrometers or more, for example, in a range of 200 to 400 micrometers. When the width of the inner wall portion 117 is larger than the range, the space in which the light emitting devices 151 and 153 are disposed is reduced, so that the device size is reduced.

The inner wall portion 117 may have a thickness greater than the thickness of the light emitting devices 151 and 153, for example, and may be formed to have a thickness equal to or greater than a depth of the cavity. A height of an upper surface of the inner wall portion 117 may be higher than a height of an upper surface of the light emitting devices 151 and 153, and may be, for example, the same height as the upper surface of the reflective sidewall 110A. The inner wall portion 117 may have a long straight shape in one direction, and may include an oblique shape. The side cross section of the inner wall portion 117 may have a hemispherical shape, a semi-elliptic shape, or a polygonal shape.

The inner wall portion 117 may be disposed along the first and second light emitting devices 151 and 153. Since the first and second light emitting devices 151 and 153 are blocked by the inner wall 117, the reflection efficiency of the light emitted from the first and second light emitting devices 151 and 153 may be improved. The inner wall portion 117 may separate from a space where the first and second frames 120 and 130 are disposed and may separate from a space where the third and fourth frames 134 and 140 are disposed. Both ends of the inner wall portion 117 may be in contact with the reflective sidewall 110A or integrally formed with the reflective sidewall 110A. The inner wall portion 117 may be formed of the same material as the body 115 or/and the reflective sidewall 110A. The lower surface of the inner wall portion 117 may be formed integrally with the body 110 or may be separately attached. The inner wall portion 117 is an intermediate wall and may be formed of an insulating material.

The inner wall portion 117 may be formed in a direction orthogonal to a second direction in which the body 115 between the first and second frames 120 and 130 is formed.

The inner wall portion 117 may be formed of at least one selected from the group consisting of Polyphthalamide (PPA), Polychloro triphenyl (PCT), liquid crystal polymer (LCP), polyamide 9T (PA9T), silicone, epoxy molding compound (EMC: epoxy molding compound), silicone molding compound (SMC), ceramic, photo sensitive glass (PSG), sapphire (Al2O3) and the like. In addition, the inner wall portion 117 may include a high refractive filler such as TiO2 and SiO2. The inner wall portion 117 may be formed of a material of the body 115 or may be formed of another material among the materials.

In an embodiment, the brightness of the light emitting device package may be improved. The inner wall portion 117 may be disposed between the first and second light emitting devices 151 and 153 to reflect the incident light and to adjust the light directivity distribution. Accordingly, the light emitting device package may uniformly provide the light directing angle distribution in the space where the light emitting devices 151 and 153 are disposed, thereby improving the brightness and the luminance distribution.

FIG. 18 is a modification of the package of FIG. 4.

Referring to FIG. 18, the light emitting device package may include a through hole TH0 in the body 115 disposed under the light emitting devices 151 and 153. The through hole TH0 may be a hole penetrating from an upper surface to a lower surface of the body 115. The through hole TH0 may be disposed between two adjacent through holes TH3 and TH4. The position of the through hole TH0 may be the same as the position of the recess described above. The first resin 160 may be disposed in the through hole TH0. The through hole TH0 may be disposed to a body 115 between the first and second through holes TH1 and TH2 and a body 115 between the third and fourth through holes TH3 and TH4 shown in FIG. 1.

<Semiconductor Module or Light Source Module>

FIG. 19 is a semiconductor module or a light source module having a light emitting device package disclosed in the embodiment. As an example, a light emitting module having a light emitting device package according to an embodiment will be described as an example, and will be described below with reference to the description and drawings disclosed above.

FIGS. 1 and 19, in the light source module according to the embodiment, one or a plurality of light emitting device packages 100 may be disposed on the circuit board 201.

The circuit board 201 may include a substrate member having first to second pads 211 and 213. A power supply circuit for controlling the driving of the light emitting devices 151 and 153 may be provided on the circuit board 201.

Each of the frames 120 and 130 of the light emitting device package 100 may be connected to each of the pads 211 and 213 of the circuit board 201. Accordingly, the first and second light emitting devices 151 and 153 of the light emitting device package 100 may receive power from the pads 211, 213, 215, and 217 of the circuit board. Each pad 211 and 213 of the circuit board 201 may include for example, are least one material or an alloy selected from the group consisting of Ti, Cu, Ni, Au, Cr, Ta, Pt, Sn, Ag, P, Fe, Sn, Zn, and Al.

Each pad 211, 213, 215, 217 of the circuit board 201 may be disposed to overlap the frames 120, 130 and the through holes TH1, TH2, TH3, and TH4. Bonding layers 221 and 223 may be provided between the pads 211, 213, 215, 217 and the frames 120, 130. The bonding layers 221 and 223 may be connected to the frames 120 and 130 and/or the conductive layers 321 in the through holes TH1, TH2, TH3, and TH4.

According to the light emitting device package according to the embodiment, the bonding portions 51, 52, 61, and 62 of the light emitting devices 151 and 153 may be formed in the conductive layers disposed in the through holes TH1, TH2, TH3, and TH4 of the frames 120 and 130. The driving power may be provided through 321. The melting point of the conductive layer 321 disposed in the through holes TH1, TH2, TH3, and TH4 may be selected to have a higher value than the melting point of the general bonding material. The light emitting device package according to the embodiment does not have a re-melting phenomenon even when bonded to a main board through a reflow process, so that electrical connection and physical bonding force are not degraded. According to the light emitting device package according to the embodiment, the package body 110 and the body 115 do not need to be exposed to high temperatures in the process of manufacturing the light emitting device package. Therefore, according to the embodiment, it is possible to prevent the package body 110 and the body 115 from being damaged or discolored due to exposure to high temperature.

The light emitting device package 100 according to an embodiment may be mounted on a sub-mount, a circuit board, or the like. However, when a conventional light emitting device package is mounted on a sub-mount, a circuit board or the like, a high temperature process such as reflow may be applied. In the reflow process, a re-melting phenomenon may occur in a bonding region between the frame provided in the light emitting device package and the light emitting device, so that the stability of the electrical connection and physical bonding may be deteriorated, thereby changing the position of the light emitting device and thus, the optical and electrical characteristics and reliability of the light emitting device package may be deteriorated. However, according to the light emitting device package of an embodiment, the first bonding portion of the light emitting device according to an embodiment may receive driving power through the conductive layer disposed in the through hole. In addition, the melting point of the conductive layer disposed in the through hole may be selected to have a higher value than the melting point of a conventional bonding material. Therefore, even when the light emitting device package 100 according to an embodiment is bonded to a main substrate through a reflow process, since re-melting phenomenon does not occur, the electrical connection and physical bonding force are not deteriorated.

FIG. 20 is a plan view showing a light emitting device according to an embodiment of the invention, FIG. 21 is a cross-sectional view taken along the line F-F of the light emitting device shown in FIG. 20

For better understanding, though disposed under the first bonding part 1171 and the second bonding part 1172, FIG. 20 shows a first sub-electrode 1141 electrically connected to the first bonding part 1171, and a second sub-electrode 1142 electrically connected to the second bonding part 1172.

As shown in FIG. 21, the light emitting device 1000 according to the embodiment may include a light emitting structure 1110 disposed on a substrate 1105.

The substrate 1105 may be selected from the group including a sapphire substrate (Al2O3), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

The light emitting device 1000 according to the embodiment may include a transparent electrode layer 1130. The transparent electrode layer 1130 may increase light output by improving a current diffusion. For example, the transparent electrode layer 1130 may include at least one selected from the group including a metal, metal oxide, and metal nitride. The transparent electrode layer 1130 may include a light transmissive material. The transparent electrode layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The light emitting device 1000 according to the embodiment may include a reflective layer 1160. The reflective layer 1160 may include a first reflective layer 1161, a second reflective layer 1162, and a third reflective layer 1163. The reflective layer 1160 may be disposed on the transparent electrode layer 1130. The second reflective layer 1162 may include a first opening h1 for exposing the transparent electrode layer 1130. The second reflective layer 1162 may include a plurality of first openings h1 disposed on the transparent electrode layer 1130. The first reflective layer 1161 may include second openings h2 for exposing an upper surface of the first conductivity type semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

The reflective layer 1160 according to the embodiment may make contact with the second conductivity type semiconductor layer 1113 through contact holes provided in the transparent electrode layer 1130. The reflective layer 1160 may physically make contact with an upper surface of the second conductivity type semiconductor layer 1113 through the contact holes provided in the transparent electrode layer 1130.

The reflective layer 1160 may be provided as an insulating reflective layer. For example, the reflective layer 1160 may be provided as a distributed Bragg reflector (DBR) layer. In addition, the reflective layer 1160 may be provided as an omni directional reflector (ODR) layer. In addition, the reflective layer 1160 may be provided by stacking the DBR layer and the ODR layer.

The light emitting device 1000 according to the embodiment may include the first sub-electrode 1141 and the second sub-electrode 1142. The first sub-electrode 1141 may be electrically connected to the first conductivity type semiconductor layer 1111 in the second opening h2. The first sub-electrode 1141 may be disposed on the first conductivity type semiconductor layer 1111. For example, according to the light emitting device 1000 of the embodiment, the first sub-electrode 1141 may be disposed on the upper surface of the first conductivity type semiconductor layer 1111 within the recess disposed to a partial region of the first conductivity type semiconductor layer 1111 through the second conductivity type semiconductor layer 1113 and the active layer 1112.

The first sub-electrode 1141 may be electrically connected to the upper surface of the first conductivity type semiconductor layer 1111 through the second opening h2 provided in the first reflective layer 1161. The second opening h2 and the recess may vertically overlap each other. For example, the first sub-electrode 1141 may make direct contact with the upper surface of the first conductivity type semiconductor layer 1111 in recess regions.

The second sub-electrode 1142 may be electrically connected to the second conductivity type semiconductor layer 1113. The second sub-electrode 1142 may be disposed on the second conductivity type semiconductor layer 1113. According to the embodiment, the transparent electrode layer 1130 may be disposed between the second sub-electrode 1142 and the second conductivity type semiconductor layer 1113.

The second sub-electrode 1142 may be electrically connected to the second conductivity type semiconductor layer 1113 through the first opening h1 provided in the second reflective layer 1162. For example, the second sub-electrode 1142 may be electrically connected to the second conductivity type semiconductor layer 1113 through the transparent electrode layer 1130 in P regions.

The second sub-electrode 1142 may make direct contact with an upper surface of the transparent electrode layer 1130 through a plurality of first openings h1 provided in the second reflective layer 1162 in the P regions. According to the embodiment, the first sub-electrode 1141 and the second sub-electrode 1142 may have polarities to each other and may be spaced apart from each other.

The first sub-electrode 1141 and the second sub-electrode 1142 may be formed with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf. The regions R11, R12 and R13 in FIG. 21 show to distinguish overlapping regions for each of the sub-electrodes.

The light emitting device 1000 according to the embodiment may include a protective layer 1150. The protective layer 1150 may include third openings h3 for exposing the second sub-electrode 1142. The third openings h3 may be disposed corresponding to PB regions provided in the second sub-electrode 1142. In addition, the protective layer 1150 may include fourth openings h4 for exposing the first sub-electrode 1141. The fourth openings h4 may be disposed corresponding to NB regions provided in the first sub-electrode 1141. The protective layer 1150 may be disposed on the reflective layer 1160. The protective layer 1150 may be disposed on the first reflective layer 1161, the second reflective layer 1162, and the third reflective layer 1163. For example, the protective layer 1150 may be provided as an insulating material. For example, the protective layer 1150 may be formed of at least one material selected from the group including $SiO_y$, $SiO_xN_y$, $Si_xN_y$, and $Al_xO_y$.

The light emitting device 1000 according to the embodiment may include the first bonding part 1171 and the second bonding part 1172 disposed on the protective layer 1150. The first bonding part 1171 may be disposed on the first reflective layer 1161. In addition, the second bonding part 1172 may be disposed on the second reflective layer 1162. The second bonding part 1172 may be spaced apart from the first bonding part 1171. The first bonding part 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first bonding part 1171 may be uniformly distributed in a horizontal direction of the first sub-electrode 1141, thus the current may be uniformly injected in the NB regions.

In addition, the second bonding part 1172 may make contact with an upper surface of the second sub-electrode 1142 through the third openings h3 provided in the protective layer 1150 in the PB regions. When the PB regions and the first openings h1 are not vertically overlapped with each other, a current injected into the second bonding part 1172 may be uniformly distributed in a horizontal direction of the second sub-electrode 1142, thus the current may be uniformly injected in the PB regions. Thus, according to the embodiment, because the power may be supplied through the regions, a current dispersion effect can be generated and an operating voltage can be reduced according to the increase of a contact area and the dispersion of a contact region.

Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved. The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of TiO2, SiO2, Ta2O5, and HfO2. Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112. In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the third reflective layer 1163 is not provided among the surfaces on which the first bonding part 1171 and the second bonding part 1172 are disposed.

Accordingly, the light emitting device 1000 according to the embodiment may emit the light in six-surfaced directions surrounding the light emitting structure 1110, and remarkably improve the light intensity.

Meanwhile, according to the light emitting device of the embodiment, when viewed from the top of the light emitting device 1000, the sum of the areas of the first bonding part 1171 and the second bonding part 1172 is less than or equal to 60% of the total area of the upper surface of the light emitting device 1000 on which the first bonding part 1171 and the second bonding part 1172 are disposed.

For example, the total area of the upper surface of the light emitting device 1000 may correspond to the area defined by a lateral length and a longitudinal length of the lower surface of the first conductivity type semiconductor layer 1111 of the light emitting structure 1110. In addition, the total area of the upper surface of the light emitting device 1000 may correspond to the area of an upper surface or a lower surface of the substrate 1105.

Accordingly, the sum of the areas of the first bonding part 1171 and the second bonding part 1172 is equal to or less than 60% of the total area of the light emitting device 1000, so that the amount of light emitted to the surface on which the first bonding part 1171 and the second bonding part 1172 are disposed may be increased. Thus, according to the embodiment, because the amount of the light emitted in the six-surfaced directions of the light emitting device 1000 is increased, the light extraction efficiency may be improved and the light intensity Po may be increased.

In addition, when viewed from the top of the light emitting device, the sum of the areas of the first bonding part 1171 and the second bonding part 1172 is equal to or greater than 30% of the total area of the light emitting device 1000.

Accordingly, the sum of the areas of the first bonding part 1171 and the second bonding part 1172 is equal to or greater than 30% of the total area of the light emitting device 1000, so that a stable mount may be performed through the first bonding part 1171 and the second bonding part 1172, and electrical characteristics of the light emitting device 1000 may be ensured.

The sum of the areas of the first bonding part 1171 and the second bonding part 1172 may be selected as 30% to 60% with respect to the total area of the light emitting device 1000 in consideration of ensuring the light extraction efficiency and the bonding stability.

In other words, when the sum of the areas of the first bonding part 1171 and the second bonding part 1172 is 30% to 100% with respect to the total area of the light emitting device 1000, the electrical characteristics of the light emitting device 1000 may be ensured and bonding strength to be mounted on the light emitting device package may be ensured, so that stable mount may be performed.

In addition, when the sum of the areas of the first bonding part 1171 and the second bonding part 1172 is more than 0% and equal to or less than 60% of the total area of the light emitting device 1000, the amount of light emitted to the surface on which the first bonding part 1171 and the second bonding part 1172 are disposed increases, so that the light extraction efficiency of the light emitting device 1000 may be improved and the light intensity Po may be increased.

In the embodiment, the sum of the areas of the first bonding part 1171 and the second bonding part 1172 is selected as 30% to 60% of the total area of the light emitting device 1000 so as to ensure the electrical characteristics of the light emitting device 1000 and the bonding strength to be mounted on the light emitting device package and increase the light intensity.

In addition, according to the light emitting device 1000 of the embodiment, the third reflective layer 1163 may be disposed between the first bonding part 1171 and the second bonding part 1172. For example, the length W5 of the third reflective layer 1163 in major axial direction of the light emitting device 1000 may correspond to the distance between the first bonding part 1171 and the second bonding part 1172. In addition, for example, the area of the third reflective layer 1163 may be 10% to 25% of the entire upper surface of the light emitting device 1000.

When the area of the third reflective layer 1163 is 10% or more of the entire upper surface of the light emitting device 1000, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1000 to ensure the light extraction efficiency more, and the area of the third reflective layer 1163 may be arranged to more than 25% and less than 100% of the entire upper surface of the light emitting device 1000 to prevent the package body from being discolored or cracked.

In addition, the light generated from the light emitting structure 1110 may be transmitted and emitted through a second region provided between a side surface arranged in the major axial direction and the first bonding part 1171 or the second bonding part 1172 adjacent to the side surface.

In addition, the light generated from the light emitting structure 1110 may be transmitted and emitted through a third region provided between a side surface arranged in a minor axial direction and the first bonding part 1171 or the second bonding part 1172 adjacent to the side surface.

According to the embodiment, the size of the first reflective layer 1161 may be several micrometers larger than the size of the first bonding part 1171. For example, the area of the first reflective layer 1161 may be provided in a size to completely cover the area of the first bonding part 1171. In consideration of a process error, for example, the length of one side of the first reflective layer 1161 may be greater than the length of one side of the first bonding part 1171 by about 4 micrometers to about 10 micrometers.

In addition, the size of the second reflective layer 1162 may be several micrometers larger than the size of the second bonding part 1172. For example, the area of the second reflective layer 1162 may be provided in a size to completely cover the area of the second bonding part 1172. In consideration of a process error, for example, the length of one side of the second reflective layer 1162 may be greater than the length of one side of the second bonding part 1172 by about 4 micrometers to about 10 micrometers.

According to the embodiment, light emitted from the light emitting structure 1110 may be reflected without being incident on the first bonding part 1171 and the second bonding part 1172 by the first reflective layer 1161 and the second reflective layer 1162. Thus, according to the embodiment, a loss of the light generated and emitted from the light emitting structure 1110 and incident to the first bonding part 1171 and the second bonding part 1172 may be minimized.

In addition, according to the light emitting device 1000 of the embodiment, because the third reflective layer 1163 is disposed between the first bonding part 1171 and the second bonding part 1172, the amount of light emitted between the first bonding part 1171 and the second bonding part 1172 may be adjusted.

As described above, the light emitting device 1000 according to the embodiment may be provided as a light emitting device package after being mounted, for example, in a flip chip bonding scheme. Herein, when the package body mounted thereon with the light emitting device 1000 is provided with resin or the like, the package body is discolored or cracked in the lower region of the light emitting device 1000 due to strong short-wavelength light emitted from the light emitting device 1000.

However, according to the light emitting device 1000 of the embodiment, because the amount of light emitted between the region on which the first bonding part 1171 and the second bonding part 1172 are disposed is adjusted, the package body disposed in the lower region of the light emitting device 1000 may be prevented from being discolored or cracked.

According to the embodiment, the light generated from the light emitting structure 1000 may be transmitted and emitted through 20% or more of the area of the upper surface of the light emitting device 1000 on which the first bonding part 1171, the second bonding part 1172 and the third reflective layer 1163.

Thus, according to the embodiment, because the amount of the light emitted in the six-surfaced directions of the light emitting device 1000 is increased, the light extraction efficiency may be improved and the light intensity Po may be increased. In addition, the package body disposed adjacent to the lower surface of the light emitting device 1000 may be prevented from being discolored or cracked.

In addition, according to the light emitting device 1000 of the embodiment, a plurality of contact holes C1, C2, and C3 may be provided in the transparent electrode layer 1130. The second conductivity type semiconductor layer 1113 may be bonded to the reflective layer 1160 through the plurality of contact holes C1, C2, and C3 provided in the transparent electrode layer 1130. The reflective layer 1160 makes directly contact with the second conductivity type semiconductor layer 1113, so that the adhesive strength may be improved as compared with the case that the reflective layer 1160 makes contact with the transparent electrode layer 1130.

When the reflective layer 1160 makes direct contact with only the transparent electrode layer 1130, the bonding strength or adhesive strength between the reflective layer 1160 and the transparent electrode layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the transparent electrode layer 1130 is weak, peeling may incur between the two layers. Thus, when the peeling incurs between the reflective layer 1160 and the transparent electrode layer 1130, the characteristics of the light emitting device 1000 may deteriorate and the reliability of the light emitting device 1000 may not be ensured.

However, according to the embodiment, because the reflective layer 1160 can make direct contact with the second conductivity type semiconductor layer 1113, the bonding strength and adhesive strength may be stably provided between the reflective layer 1160, the transparent electrode layer 1130, and the second conductivity type semiconductor layer 1113.

Thus, according to the embodiment, because the bonding strength between the reflective layer 1160 and the second conductivity type semiconductor layer 1113 may be stably provided, the reflective layer 1160 may be prevented from being peeled off from the transparent electrode layer 1130. In addition, because the bonding strength between the reflective layer 1160 and the second conductivity type semiconductor layer 1113 may be stably provided, the reliability of the light emitting device 1000 may be improved.

Meanwhile, as described above, the transparent electrode layer 1130 may be provided with the contact holes C1, C2, and C3. The light emitted from the active layer 1112 may be incident to and reflected by the reflective layer 1160 through the contact holes C1, C2, and C3 provided in the transparent electrode layer 1130. Accordingly, the loss of the light generated from the active layer 1112 and incident to the transparent electrode layer 1130 is reduced, so that the light extraction efficiency may be improved. Thus, according to the light emitting device 1000 of the embodiment, the light intensity may be improved.

As described above, according to the semiconductor device package and the method of manufacturing a semiconductor device package of an embodiment, the bonding parts of the light emitting device 120 of the embodiment may be receive by driving power supplied through the conductive layer which is disposed at the through hole. In addition, the melting point of the conductive layer disposed in the through hole may be selected to have a higher value than the melting point of a conventional bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 of an embodiment, the package body 110 does not need to be exposed to a high temperature in the process of manufacturing a light emitting device package. Therefore, according to the embodiment, the package body may be prevented from being exposed to high temperatures to be damaged or discolored. Accordingly, the selection range for the material constituting the body 115 may be widened. According to an embodiment, the body may be provided by using a relatively inexpensive resin material as well as an expensive material such as ceramic.

Meanwhile, the light emitting device package according to an embodiment may be applied to a light source unit.

In addition, the light source unit may include a display device, a lighting device, a head lamp, and the like according to an industrial field.

As an example of the light source unit, a display device may include a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may have a structure in which light emitting devices that emit red, green and blue light are disposed, respectively.

As still another example of the light source unit, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source unit, the lighting device may include a cover, a light source module, a heat radiator, a power supply, an inner case, and a socket. In addition, the light source unit according to an embodiment may further include at least one of a member and a holder. The light source module may include a light emitting device package according to an embodiment.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device package comprising:
   first and second frames spaced apart from each other;
   a body disposed between the first and second frames;
   a light emitting devices disposed on the first and second frames; and
   a first resin disposed between the body and the light emitting device,
   wherein each of the first and second frames includes a through hole,
   wherein the through holes of the first and second frames overlap the light emitting device in a vertical direction,
   wherein the body includes a recess recessed toward a lower surface of the body between the first and second frames,
   wherein the recess overlaps the light emitting device in the vertical direction;
   wherein the first resin is disposed in the recess,
   wherein a length of the recess in a first direction is smaller than a width of the light emitting device,
   wherein a through hole of the first frame overlaps a first bonding portion of the light emitting device in the vertical direction, and
   wherein a through hole of the second frame overlaps a second bonding portion of the light emitting device in the vertical direction.

2. The light emitting device package of claim 1,
   wherein the through hole of the first frame and the through hole of the second frame are spaced apart from the body, and
   wherein the recess is disposed on the body disposed between the plurality of through holes.

3. The light emitting device package of claim 2,
wherein the light emitting device includes plurality of light emitting devices spaced apart from each other in the first direction, and
wherein the recess is formed in plurality of recesses disposed under each of the plurality of light emitting devices.

4. The light emitting device package of claim 3,
wherein the first frame includes a first upper recess in which an upper surface is concave,
wherein the second frame includes a second upper recess in which an upper surface is concave,
wherein the body extends in the first and second upper recesses, and
wherein the first and second upper recesses are disposed around the through hole.

5. The light emitting device package of claim 4,
wherein an interval between the plurality of light emitting devices is smaller than an interval between the recesses disposed under different light emitting devices from each other.

6. The light emitting device package of claim 4,
wherein a distance between a lower portion of each of the through holes and the first and second upper recesses is 80 micrometers or more.

7. The light emitting device package of claim 4,
wherein the plurality of recesses disposed under each of the light emitting devices further extend outwardly than both sides of the light emitting devices.

8. The light emitting device package of claim 4,
wherein the plurality of light emitting devices are connected in parallel,
comprising a conductive layer disposed in each of the through holes.

9. A light emitting device package comprising:
a circuit board having a plurality of pads disposed thereon; and
a light emitting device package disposed on the plurality of pads,
wherein the light emitting device package,
first and second frames;
a body disposed between the first and second frames;
a first light emitting devices disposed in first regions of the first and second frames;
a second light emitting device on second regions of the first and second frames; and
a first resin between the body and the first and second light emitting devices,
wherein the first and second light emitting devices include first and second bonding portions thereunder,
wherein the first and second frames disposed in the first region include first and second through holes under the first and second bonding portions of the first light emitting device,
wherein the first and second frames disposed in the second region include third and fourth through holes under the first and second bonding portions of the second light emitting device,
wherein the body includes a first recess disposed between the first and second through holes and overlapping the first light emitting device in a vertical direction; and a second recess disposed between the third and fourth through holes and overlapping the second light emitting device in the vertical direction,
wherein the first and second through holes overlap the first light emitting device in the vertical direction and are spaced apart from the body,
wherein the third and fourth through holes overlap the second light emitting device in the vertical direction and spaced apart from the body,
wherein the first resin is disposed in the first and second recesses, and
wherein the first to fourth through holes includes a conductive layer connecting each of the plurality of pads to each of the plurality of bonding portions.

10. A light emitting device package comprising:
first and second frames spaced apart from each other;
a body disposed between the first and second frames; and
at least one light emitting device disposed on the first and second frame,
wherein the first frame has at least one first through hole,
wherein the second frame has at least one second through hole,
wherein the light emitting device includes a first bonding portion facing the first frame and a second bonding portion facing the second frame,
wherein the first through hole faces a portion of a lower surface of the first bonding portion,
wherein the second through hole faces a portion of the lower surface of the second bonding portion,
wherein the body is spaced apart from the first through hole and the second through hole,
wherein the body includes a recess recessed toward a lower surface from a top surface of the body, and
wherein the recess of the body overlaps the light emitting device in the vertical direction and has a length in the first direction greater than a width of a second direction orthogonal to the first direction.

11. The light emitting device package of claim 10,
wherein the first frame has a plurality of first through holes spaced apart in the first direction,
wherein the second frame has a plurality of second through holes spaced apart in the first direction, and
wherein the light emitting device includes a plurality of light emitting devices spaced apart in the first direction.

12. The light emitting device package of claim 10, comprising:
a reflective sidewall coupled to the body, the first and second frames,
wherein the reflective sidewall includes a cavity that an upper surface is open, and
wherein the light emitting device is disposed in the cavity.

13. The light emitting device package of claim 12,
wherein the first frame includes a first upper recess concave from an upper surface of the first frame,
wherein the second frame includes a second upper recess concave from an upper surface of the second frame,
wherein an inner portion of the reflective sidewall extends in the first and second upper recesses,
wherein the first upper recess is disposed at a bottom of the cavity and is disposed around the first through hole, and
wherein the second upper recess is disposed on the bottom of the cavity and is disposed around the first through hole.

14. The light emitting device package of claim 10, comprising:
a first resin disposed between the body and the light emitting element,
wherein the first resin is disposed between upper surfaces of the first and second frames and a lower surface of the light emitting device.

15. The light emitting device package of claim 14, wherein the first resin is disposed in the recess and includes a reflective resin material.

16. The light emitting device package of claim 14, wherein an area of upper surface of each of the first through hole and the second through hole is greater than an area of lower surface of each of the first through hole and the second through hole.

17. The light emitting device package of claim 10, wherein the length of the recess in the first direction is smaller than a width of the light emitting device, and
wherein the first through hole and the second through hole under the light emitting device are spaced apart from in the second direction.

18. The light emitting device package of claim 17, wherein a plurality of recesses disposed under the light emitting device are spaced apart in the first direction.

19. The light emitting device package of claim 17, wherein the first frame and the second frame have a conductive layer electrically connected to the first bonding portion and the second bonding portion of the light emitting device.

20. The light emitting device package of claim 19, wherein the conductive layer is disposed in the first through hole of the first frame and the second through hole of the second frame.

* * * * *